United States Patent
Kakitsuka et al.

(10) Patent No.: US 8,306,433 B2
(45) Date of Patent: Nov. 6, 2012

(54) OPTICAL MODULATION SIGNAL GENERATING DEVICE AND OPTICAL MODULATION SIGNAL GENERATING METHOD

(75) Inventors: Takaaki Kakitsuka, Atsugi (JP); Shinji Matsuo, Atsugi (JP); Toru Segawa, Atsugi (JP); Hiroyuki Suzuki, Atsugi (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 267 days.

(21) Appl. No.: 12/664,865

(22) PCT Filed: Jun. 25, 2008

(86) PCT No.: PCT/JP2008/061559
§ 371 (c)(1),
(2), (4) Date: Apr. 14, 2010

(87) PCT Pub. No.: WO2009/001861
PCT Pub. Date: Dec. 31, 2008

(65) Prior Publication Data
US 2010/0202776 A1    Aug. 12, 2010

(30) Foreign Application Priority Data
Jun. 25, 2007  (JP) ................. 2007-166886

(51) Int. Cl.
*H04B 10/04* (2006.01)
(52) U.S. Cl. ......... 398/183; 398/185; 398/186; 398/187
(58) Field of Classification Search .................. 398/182, 398/183, 185–187, 192–194
See application file for complete search history.

(56) References Cited

U.S. PATENT DOCUMENTS

| 5,339,185 | A | * | 8/1994 | Kaede ............................ 398/180 |
| 6,215,805 | B1 |   | 4/2001 | Sartorius et al. |
| 6,519,270 | B1 | * | 2/2003 | Kim et al. ....................... 372/28 |
| RE39,785 | E | * | 8/2007 | Fuse ................................ 398/79 |
| 7,406,267 | B2 |   | 7/2008 | Mahgerefteh et al. |
| 2004/0008937 | A1 |   | 1/2004 | Mahgerefteh et al. |

(Continued)

FOREIGN PATENT DOCUMENTS
EP     1087547     3/2001
(Continued)

OTHER PUBLICATIONS

Yasuhiro Matsui et al., *Chirp-Managed Directly Modulated Laser (CML)*, IEEE Photonics Technology Letters, vol. 18 No. 2, Jan. 15, 2006, pp. 385-387.

(Continued)

*Primary Examiner* — Dalzid Singh
(74) *Attorney, Agent, or Firm* — Workman Nydegger

(57) ABSTRACT

There is provided an optical modulation signal generating device in which an operation speed is not limited by a relaxation oscillation frequency of a laser, and high-speed modulation and long-distance transmission can be performed. The optical modulation signal generating device converts a signal from a signal source into an optical signal and outputs the optical signal to a transmission medium having frequency dispersion. The optical modulation signal generating device includes an optical source (102) for performing frequency modulation by the signal from the signal source to generate an optical signal having only a frequency modulation component, and a frequency filter (103) for converting the frequency modulation component of the optical signal into an intensity modulation component and a frequency modulation component.

11 Claims, 34 Drawing Sheets

U.S. PATENT DOCUMENTS

2009/0136229 A1* 5/2009 Hoshida et al. ............... 398/1
2011/0044684 A1* 2/2011 Watanabe .................... 398/9

FOREIGN PATENT DOCUMENTS

| JP | 8-139401 | 5/1996 |
|---|---|---|
| JP | 2000-92001 | 3/2000 |
| JP | 2000-507744 | 6/2000 |
| JP | 3832743 | 4/2004 |
| JP | 2006-516075 | 6/2006 |
| JP | 2006-261590 | 9/2006 |

OTHER PUBLICATIONS

P.A. Morton et al., *38.5 km Error Free Transmission at 10Gbit/s in Standard Fibre Using a Low Chirp, Spectrally Filtered, Directly Modulated 1.55 μm DFB Laser*, Electronics Letters, vol. 33, No. 4, Feb. 13, 1997, pp. 3-311.

* cited by examiner

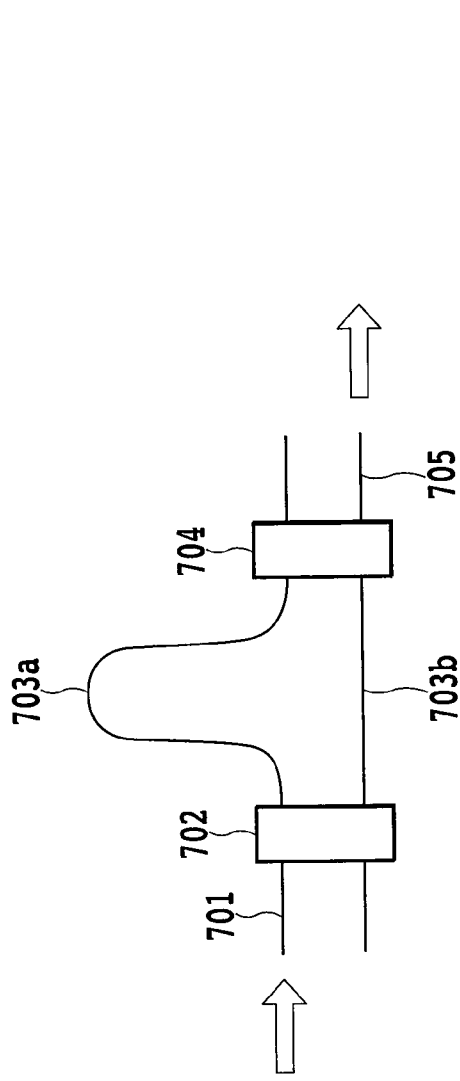
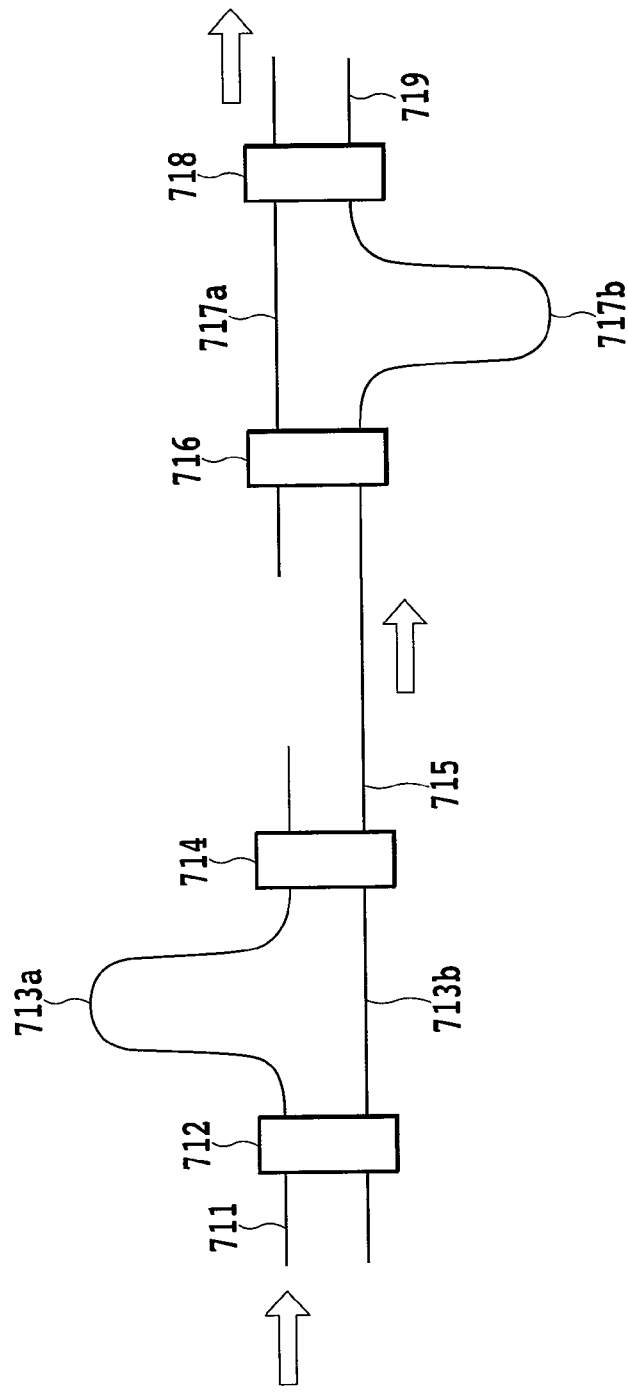

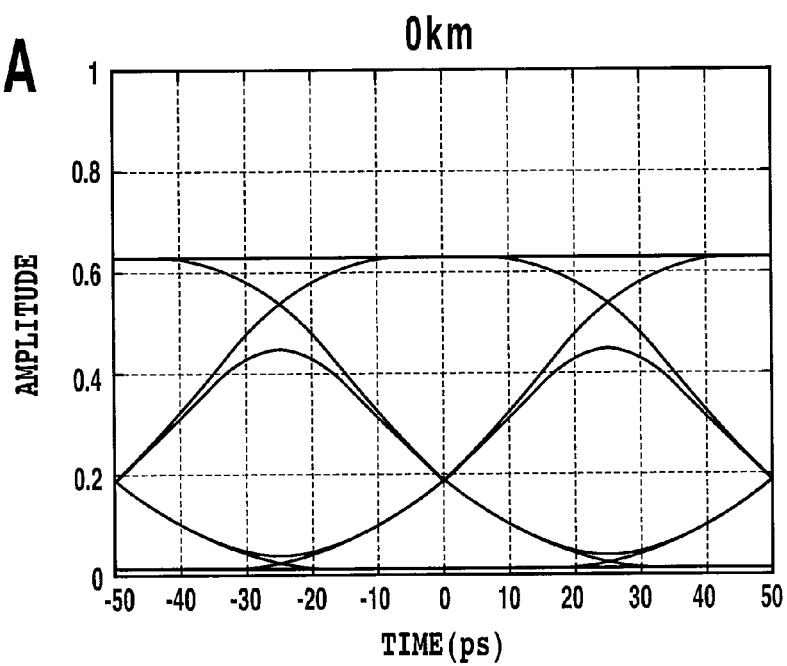
FIG.13A 0km
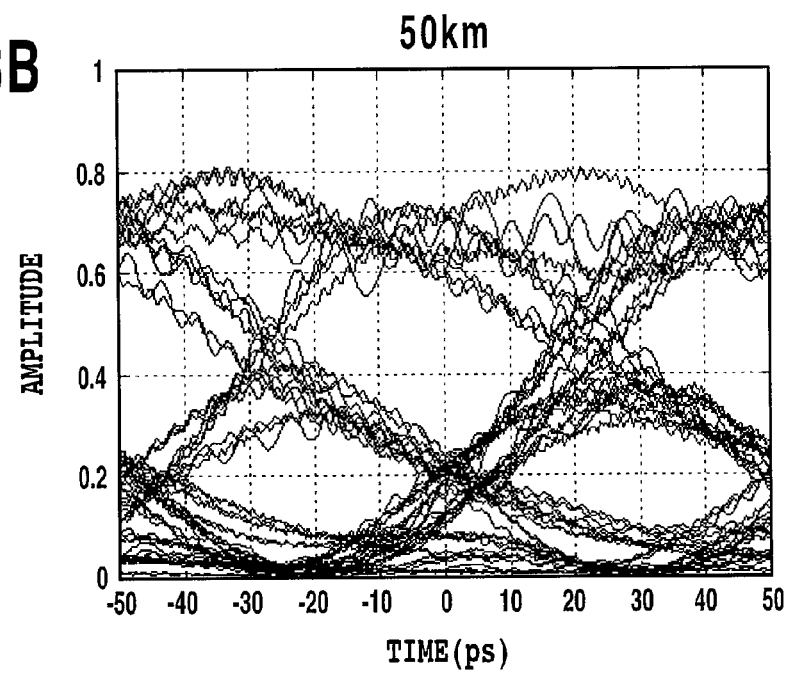
FIG.13B 50km

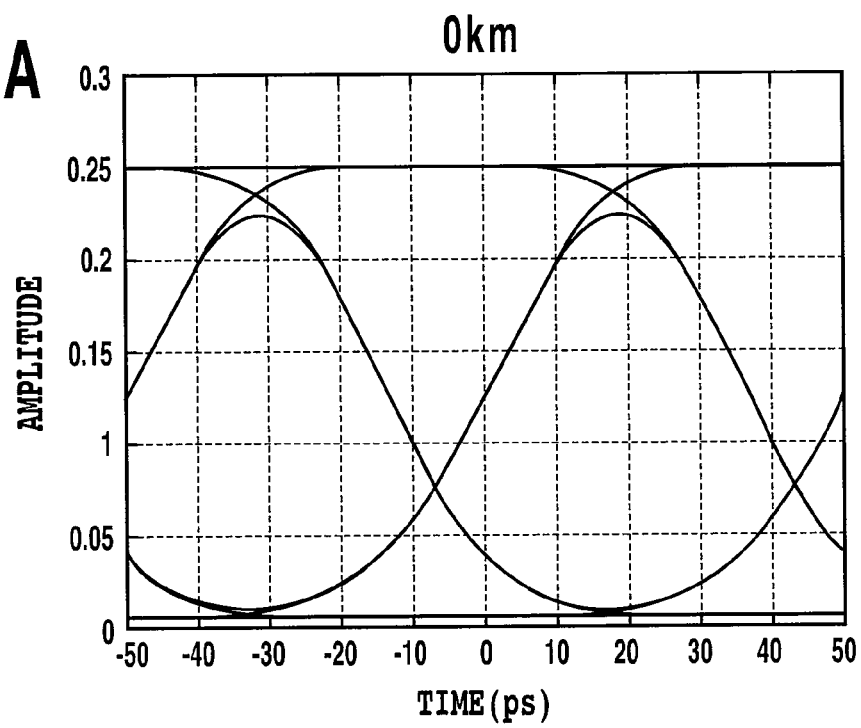
FIG.15A  0km
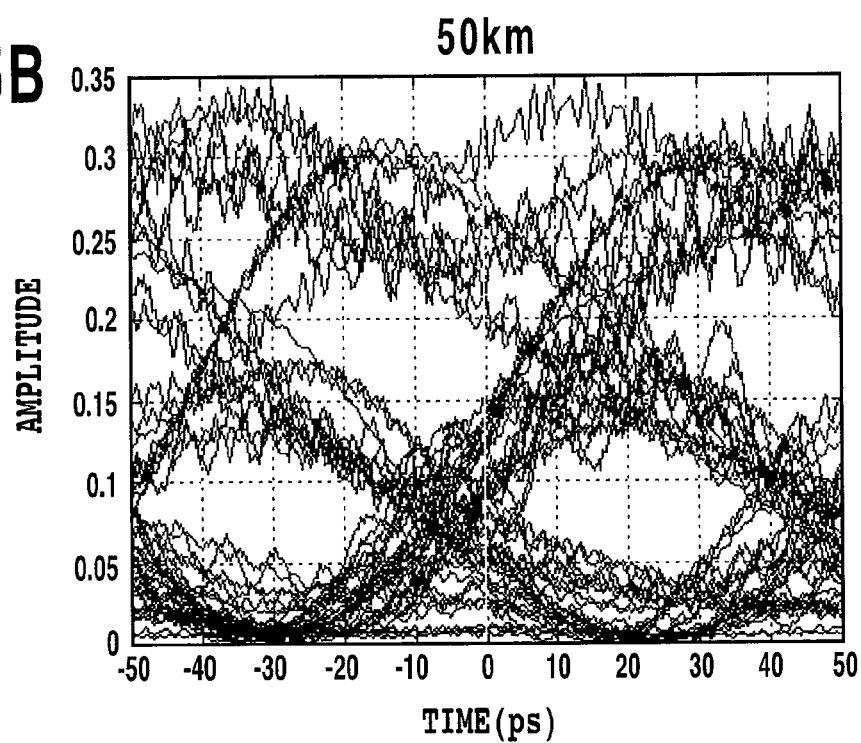
FIG.15B  50km

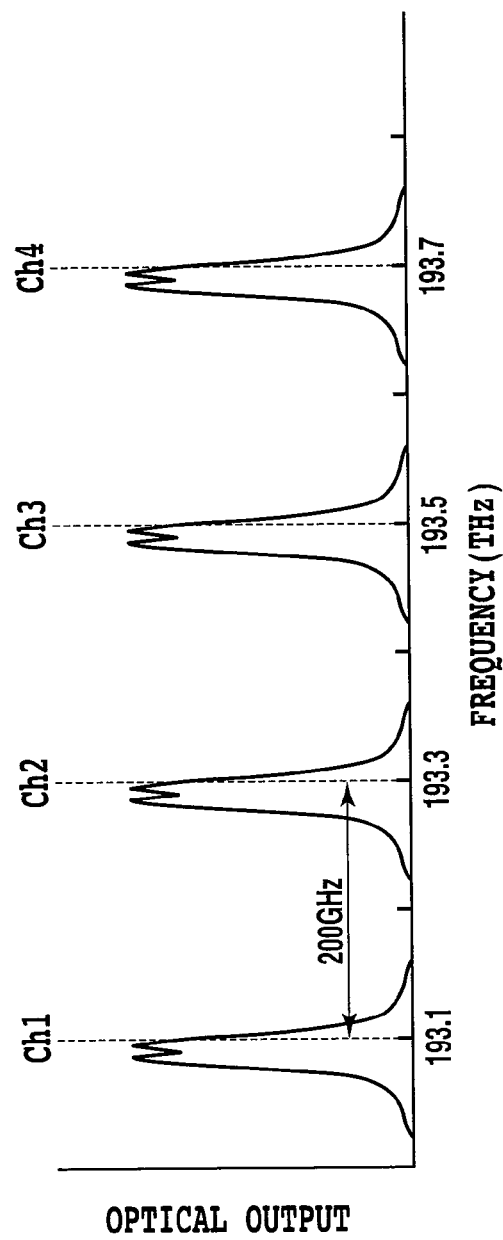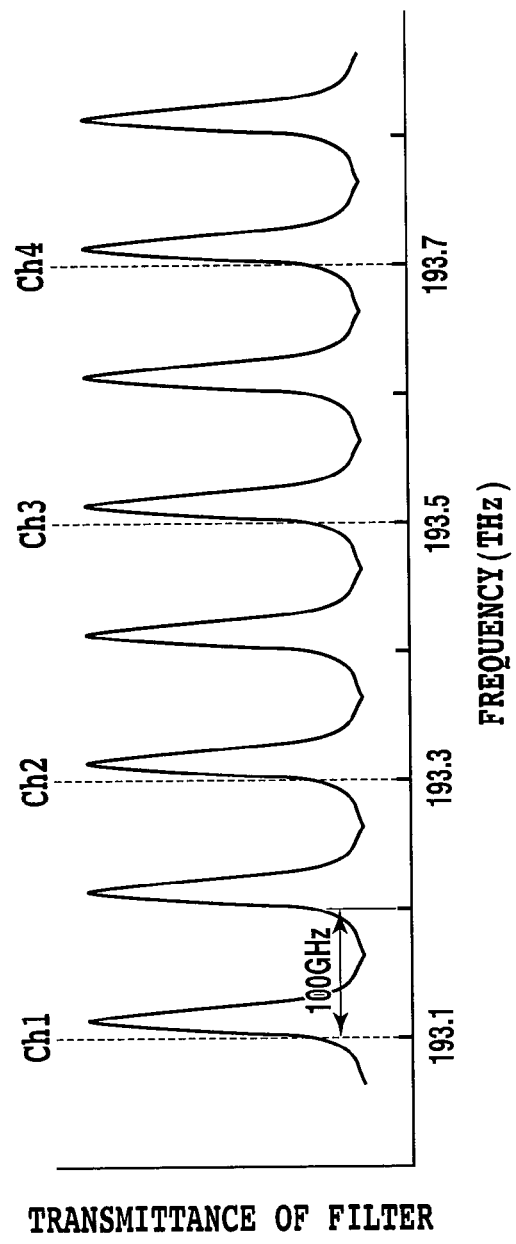

OPTICAL MODULATION SIGNAL GENERATING DEVICE AND OPTICAL MODULATION SIGNAL GENERATING METHOD

TECHNICAL FIELD

The present invention relates to an optical modulation signal generating device and an optical modulation signal generating method, and in more detail to an optical modulation signal generating device and an optical modulation signal generating method for performing transmission at a high speed and in a long distance through an optical fiber.

BACKGROUND ART

Caused by an explosive increase in transmission capacity due to recent prevalence of the Internet, a large capacity increase and high speeding in optical fiber transmission are demanding. At present, an introduction of a system having a transmission speed of 10 Gbps is going forward in a backbone network, but for meeting a demand for further larger capacity, a transmitting system having a higher transmission speed is developing. For introducing a system having a transmission speed of more than 10 Gbps, it is important to further lower costs as compared to the system of 10 Gbps. Particularly in a signal source, miniaturizing an element and driving in low power are needed, and it is also necessary to lengthen a distance which can be transmitted without relay.

As a signal source widely used at present, a system of directly modulating a laser and a system of externally modulating CW light outputted from a laser are exemplified. In the direct modulation system, a current modulating drive of a distributed feedback laser (DFB-LD) is generally used. In the external modulation system, modulators can be classified into two types of modulators composed of an electroabsorption modulator and a modulator of a phase modulation type.

In the electroabsorption type, intensity modulation is performed using an absorption change due to electric field applied to a semiconductor waveguide. In a case of a quantum well structure, a quantum-confined Stark effect (QCSE) is generally used, and in a case of a bulk structure, a Franz-Keldysh effect is generally used. In this structure, an electroabsorption modulator integrated type (EA-) DFB-LD is widely used in this structure because of easy integration with DFB-LD.

As the phase modulation type, a Mach-Zehnder modulator is used. This modulator branches input light into two optical paths by a coupler and thereafter, generates a phase difference between the respective branch lights of the two optical paths by a change of a refractive index due to electric field impression. At the time of multiplexing two branch lights having the phase difference therebetween, the intensity change by the phase difference is used to perform the intensity modulation. In regard to the refractive index change, an electro-optic (EO) effect is used in addition to the QCSE effect and the Franz-Keldysh effect. LiNbO$_3$ (LN) is widely and generally used as a material of the modulator.

The direct modulation system has a feature that the control is simple. However, there exists a problem that at current modulating, a frequency fluctuation in lasing wavelength of a laser is generated in accordance with intensity of a modulation signal. Since a propagation characteristic of an optical fiber as a transmission medium has frequency dispersion, an optical signal after the optical fiber propagation is degraded due to the frequency fluctuation of the optical signal.

FIG. 1 shows the construction of the conventional optical modulation signal transmitting system. An optical signal outputted from an optical modulation signal generating device 901 propagates through an optical fiber 902 and is received by an optical receiving device 903. It is assumed that an NRZ signal of 20 Gbps as shown in FIG. 2 is generated from a signal source of the optical modulation signal generating device 901. FIG. 3A shows an eye opening of an optical signal generated by directly modulating a laser light of the optical modulation signal generating device 901 with this NRZ signal. In the direct modulation system, a frequency fluctuation corresponding to the modulation signal is generated in the optical signal outputted from the laser. FIG. 3B shows an eye opening of an optical signal which in a case where a frequency fluctuation width is 10 GHz, propagates through the optical fiber 902 of 50 km and is received by the optical receiving device 903. It is found out that a waveform of the optical signal largely deteriorates through the optical fiber propagation.

For solving deterioration of this propagation characteristic, there is proposed a method in which a frequency filter is used to carry out mutual conversion between frequency amplitude and intensity amplitude for restricting the frequency fluctuation (for example, refer to Non-Patent Document 1). However, because of directly modulating the laser, there is a problem that an operation speed is limited by a relaxation oscillation frequency of the laser. At present, in a commercialized laser the relaxation oscillation frequency is the order of 10 GHz and it is difficult to realize modulation speed higher than that.

Since the electroabsorption modulator among the external modulation system performs an electric field drive without using a carrier, the high-speed modulation of 40 GHz is possible. However, in the modulator using the QCSE effect or the Franz-Keldysh effect, because of a drive in the vicinity of a band gap edge, a large refractive index change is generated in addition to a change in absorption coefficient. This causes a frequency fluctuation of an optical signal at the rising and falling of the optical signal. Since this frequency fluctuation causes deterioration of the optical signal at an optical fiber propagation time of the optical signal, it is difficult to perform long-distance transmission with no relay.

The phase modulation type modulator also has an advantage that likewise the high-speed modulation of 40 GHz is possible and the frequency fluctuation can be restricted. However, in a LN modulator most widely used, an element size is large and a drive voltage is higher as compared to that in a semiconductor. In addition, there is a problem that the LN modulator is not suitable for integration with DFB-LD.

The present invention is made in view of this problem and an object of the present invention is to provide an optical modulation signal generating device and an optical modulation signal generating method which realize high-speed modulation and long-distance transmission.

Patent Document 1: Japanese Patent No. 3832743 Non-Patent Document 1: P. A. Morton et al., "38.5 km error free transmission at 10 Gbit/s in standard fiber using a low chirp, specially filtered, directly modulated 1.55 mm DFB laser", Electronics Letters, vol. 33, no. 4, pp. 310-311.

DISCLOSURE OF THE INVENTION

The present invention is made for achieving such an object, and according to the invention as defined in claim 1, an optical modulation signal generating device which converts a signal from a signal source into an optical signal and outputs the optical signal to a transmission medium having frequency dispersion comprises a optical source for performing frequency modulation by a signal from the signal source to generate an optical signal having only a frequency modulation component, and a frequency filter for converting the frequency modulation component of the optical signal into an intensity modulation component and a frequency modulation component.

The optical modulation signal generating device may include a semiconductor optical amplifier which amplifies the optical signal from the optical source and outputs the amplified optical signal to the frequency filter.

The optical source is a laser including a wavelength selective filter region, a phase adjusting region and an active layer region, and performs the frequency modulation by applying a voltage to the phase adjusting region. The wavelength selective filter region may consist of any of a distributed Bragg reflector mirror, a coupled ring filter made of a plurality of ring resonators having different ring diameters, and a ladder filter in which both ends of a plurality of waveguides having different optical path lengths are connected respectively to two waveguides in a ladder shape. In addition, the optical source preferably has a value of a modulation width of the frequency modulation which is set between ¼ and ¾ of a bit rate in transmission by the optical signal.

The optical modulation signal generating device restricts a fluctuation of a frequency modulation component converted by adjusting parameters of an amplitude component and a phase component in the frequency filter. An etalon filter may be used as the frequency filter.

BRIEF DESCRIPTION OF THE DRAWINGS

FIG. 12A is a diagram showing the construction of a frequency filter using a Mach-Zehnder interferometer filter;

FIG. 12B is a diagram showing the construction of the frequency filter using the Mach-Zehnder interferometer filter;

FIG. 13A is a diagram showing an eye opening of an optical signal outputted from the optical modulation signal generating device 101;

FIG. 13B is a diagram showing an eye opening at the time of propagating an optical signal through the optical fiber for 50 km by applying the frequency filter using the Mach-Zehnder interferometer filter;

FIG. 15A is a diagram showing an eye opening of an optical signal outputted from the optical modulation signal generating device 101;

FIG. 15B is a diagram showing an eye opening at the time of propagating an optical signal through the optical fiber for 50 km by applying the frequency filter using the lattice type filter;

FIG. 30A is a diagram showing an oscillation spectrum at the time of modulating the optical source according to the fifth embodiment;

FIG. 30B is a diagram showing a transmission spectrum of the frequency filter according to the fifth embodiment.

BEST MODE FOR CARRYING OUT THE INVENTION

Hereinafter, embodiments of the present invention will be in detail explained with reference to the accompanying drawings. An optical modulation signal generating device in the present embodiment converts an optical signal having only a frequency modulation component into an intensity modulation component and a frequency modulation component using a frequency filter. At this time, a frequency fluctuation at frequency modulating is restricted. Specially as described below, a parameter of the frequency filter is set to control the frequency modulation component for restricting the frequency fluctuation in a region where an optical signal exists corresponding to a symbol sequence of "1". In consequence, since the frequency fluctuation is not substantially contained in an output optical signal and an influence of dispersion of an optical fiber can be restricted, high-speed modulation and long-distance transmission can be realized.

The frequency filter can use a filter in which a transmission function is formed in a convex shape downwards, and specially can use an etalon filter. In addition, MSK is applied to frequency modulation to restrict overlap of signals due to dispersion of pulses. Further, DBR-LD is applied to an optical source for frequency-modulating an optical signal, the optical source oscillates by current injection into an active layer region thereof and a lasing wavelength thereof is adjusted by current injection into a DBR region thereof. Since a frequency modulation signal is generated by applying a voltage to a phase adjusting region, an intensity change at electric field modulating is extremely small and an idealized frequency modulation signal having a frequency component as a main component can be generated.

First Embodiment

Figure 4:
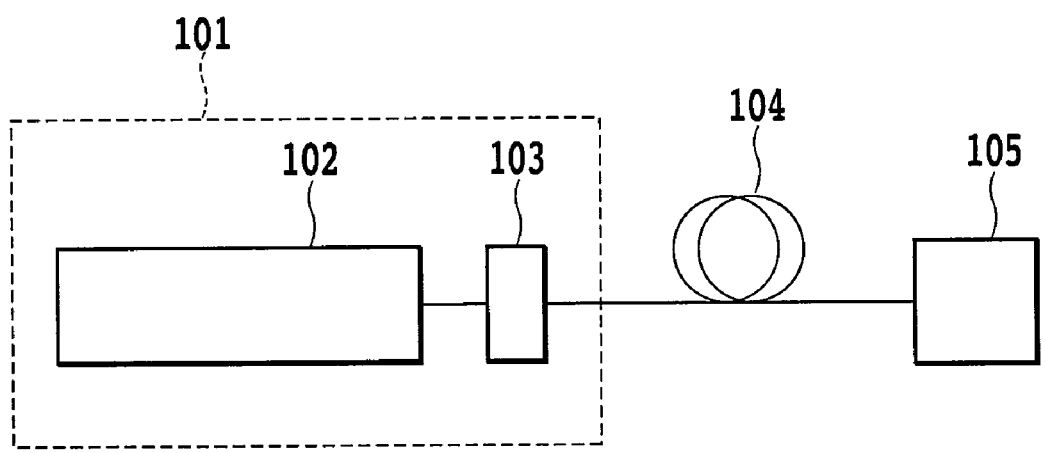
FIG. 4 is a diagram showing the construction of an optical modulation signal transmitting system according to a first embodiment of the present invention.

FIG. 4 shows the construction of an optical modulation signal transmitting system according to a first embodiment of the present invention. An optical modulation signal generating device 101 includes an optical source 102 for frequency-modulating an optical signal with an NRZ signal from a signal source and a frequency filter 103 connected to the output thereof and having a phase component. The optical signal outputted from the optical modulation signal generating device 101 propagates through an optical fiber 104 and thereafter, is received at a receiving device 105.

Figure 5:
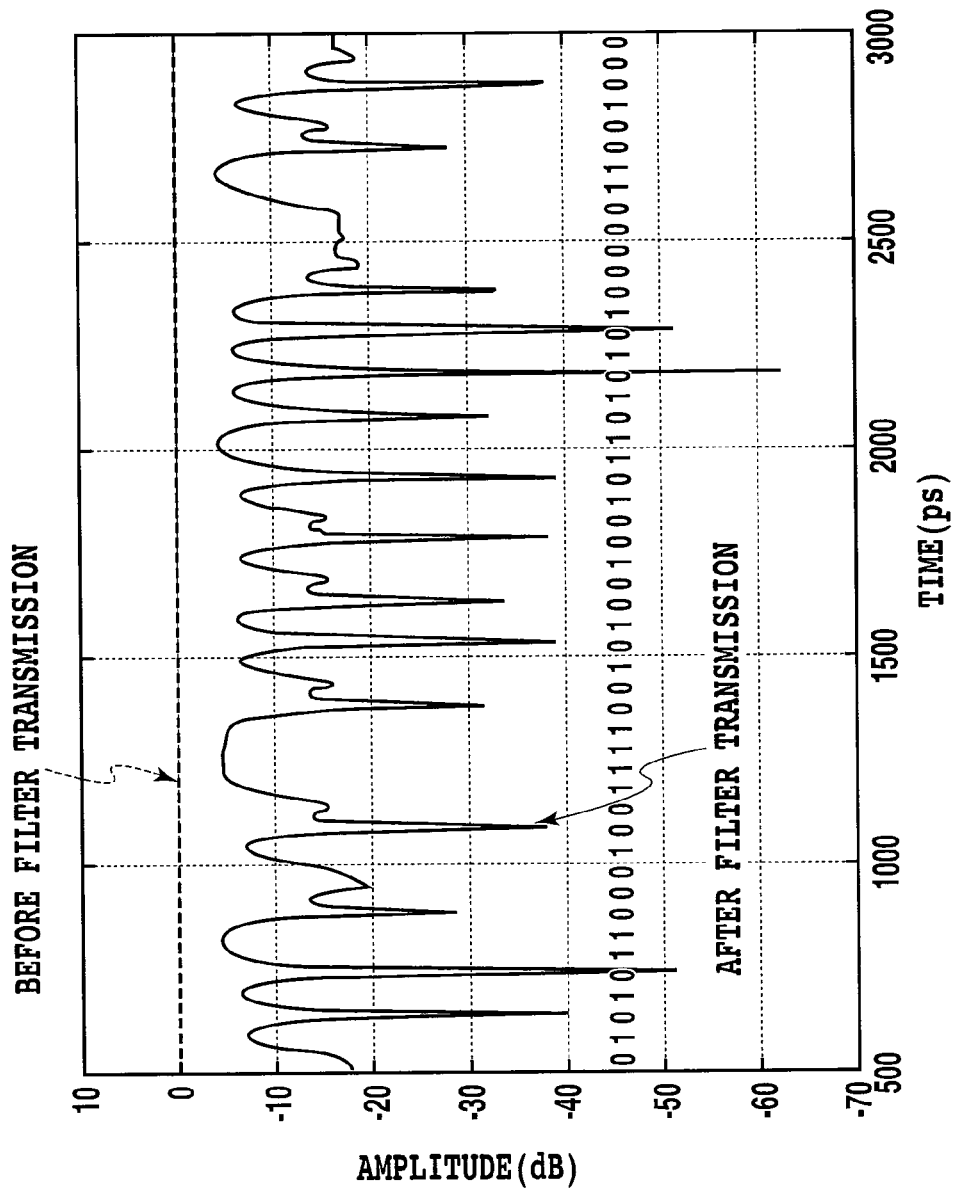
FIG. 5 is a diagram showing an intensity component of input and output optical signals of a frequency filter in the optical modulation signal generating device.
Figure 6:
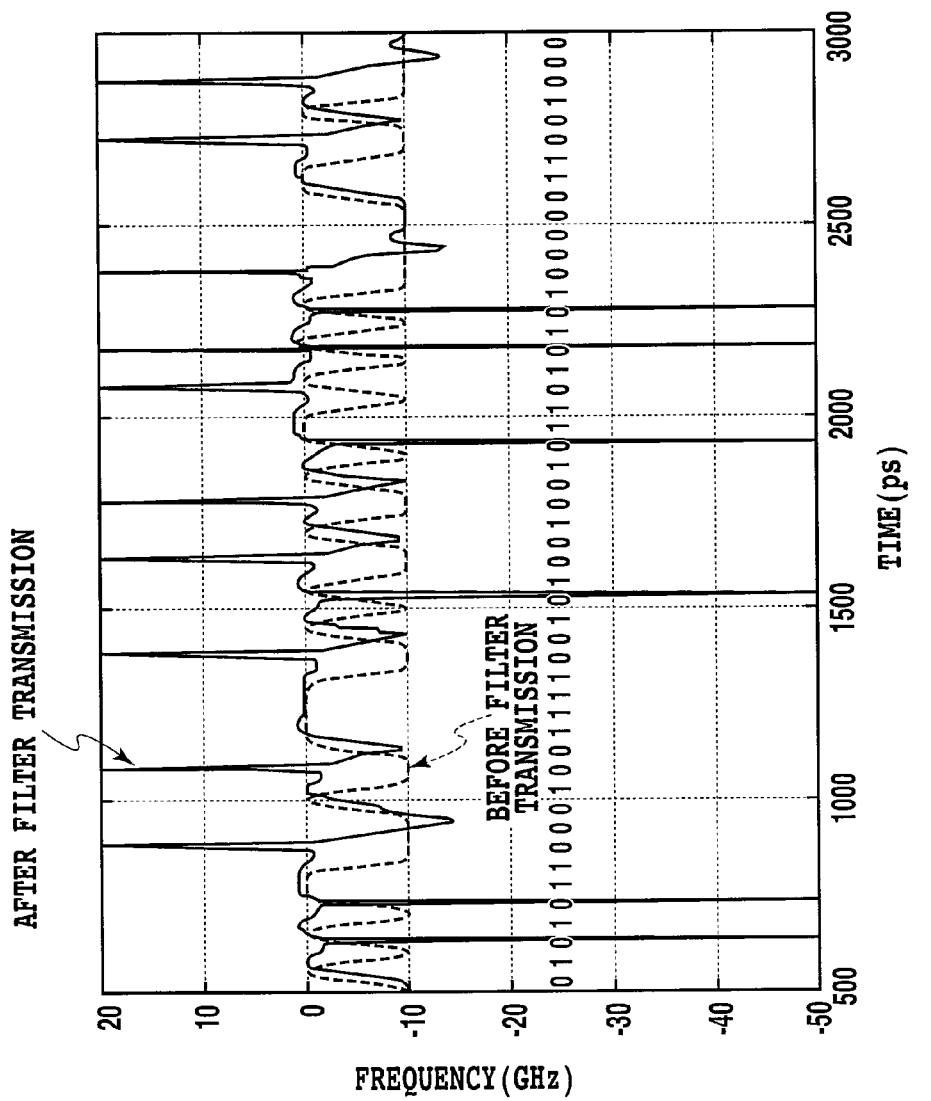
FIG. 6 is a diagram showing a frequency component of the input and output signals of the frequency filter in the optical modulation signal generating device.

FIG. 5 shows intensity components of input and output optical signals of the frequency filter in the optical modulation signal generating device, and FIG. 6 shows frequency components. In FIGS. 5 and 6, symbol sequence of "1" and "0" from the signal source are shown together. In any of them, a broken line shows a waveform before transmission of the frequency filter 103 and a solid line shows a waveform after the transmission of the frequency filter 103. In the optical source 102, an optical signal which is frequency-modulated by an NRZ signal of 20 Gbps from the signal source, that is, an input optical signal of the frequency filter 103 has a constant amplitude regardless of the symbol sequence, and as shown in FIG. 6, has modulation of a frequency component corresponding to the symbol sequence. The input optical signal is set in such a manner that a frequency of a signal corresponding to the NRZ signal of "1" has a frequency higher by 10 GHz than a frequency corresponding to the NRZ signal of "0". Thus setting half a value of a transmitting bit rate as a value of a modulation width of the frequency modulation is called a so-called MSK (Minimum Shift Keying) and provides an effect that a phase difference between neighboring pulses after optical fiber propagation is π to restrict overlap of signals due to pulse dispersion by the optical fiber propagation.

In addition, if the value of the modulation width of the frequency modulation is set between ¼ to ¾ of the transmitting bit rate by an optical signal, a phase difference between neighboring pulses of signals "1-0-1" becomes a reverse code to provide an effect of restricting overlap of signals due to pulse dispersion after the optical fiber propagation. It should be noted that every sharp peak of frequencies after filter transmission in FIG. 6 is generated in an optical signal corresponding to the NRZ signal of "0" and has no relation with a frequency fluctuation of an optical signal corresponding to the NRZ signal of "1". This sharp peak appears remarkably particularly in a case of a symbol sequence of "1-0-1" and corresponds to an event that the phase between the signals as described above sharply changes to π corresponding to the NRZ signal of "0". Therefore, it has an effect of restricting overlap of the neighboring signals generated by spread of the waveform due to propagation of the optical signal.

Figure 7:
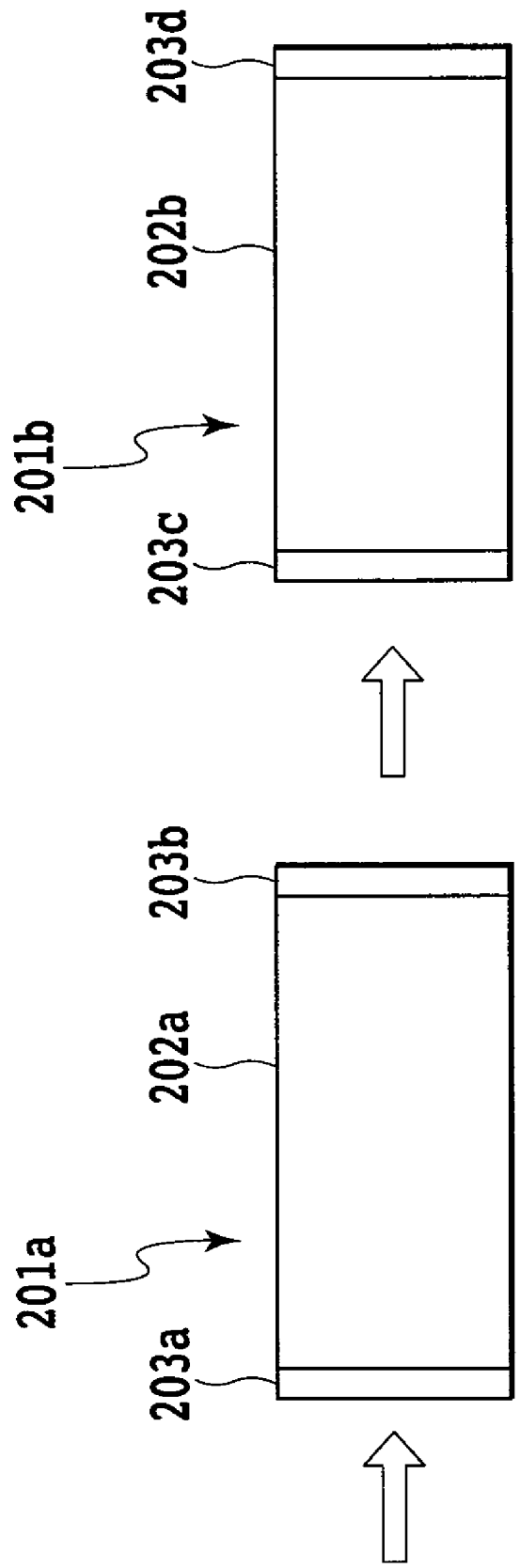
FIG. 7 is a diagram showing the construction of the frequency filter according to the first embodiment.

FIG. 7 shows the construction of the frequency filter according to the first embodiment. The frequency filter 103 is so configured that an etalon filter 201a in which mirrors 203a and 203b are provided in input and output ends of a resonator 202a and an etalon filter 201b in which mirrors 203c and 203d are provided in input and output ends of a resonator 202b are connected in two-step series. A FSR (Free Spectral Range) of the frequency filter 103 is 100 GHz.

Figure 8:
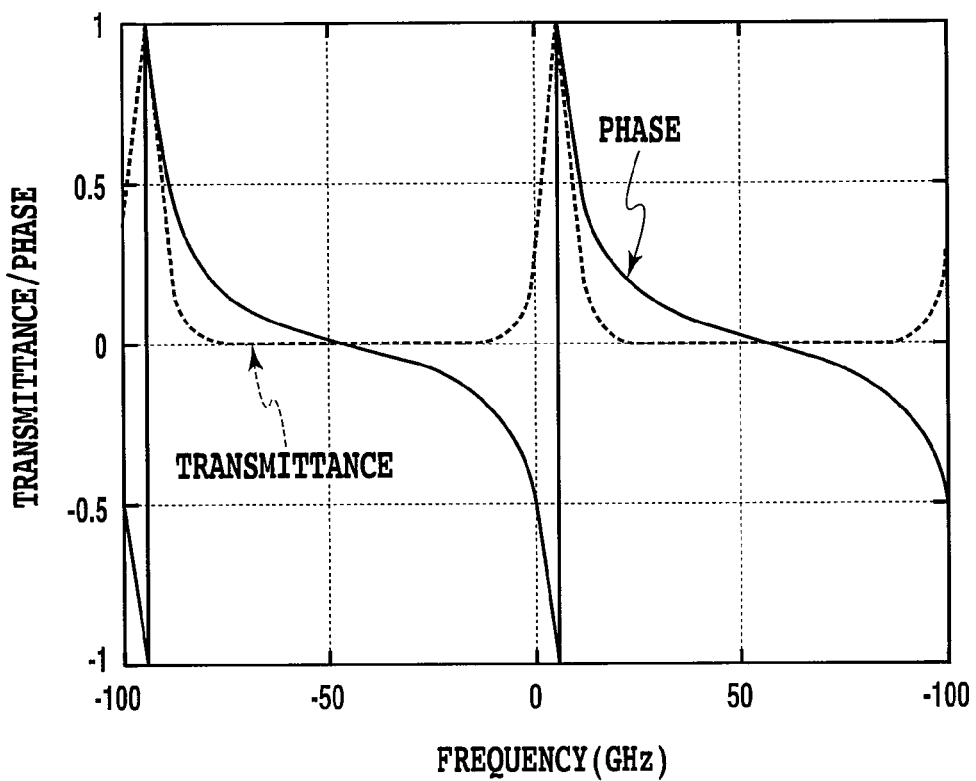
FIG. 8 is a diagram showing a transmission spectrum and a phase of the frequency filter according to the first embodiment.
Figure 9:
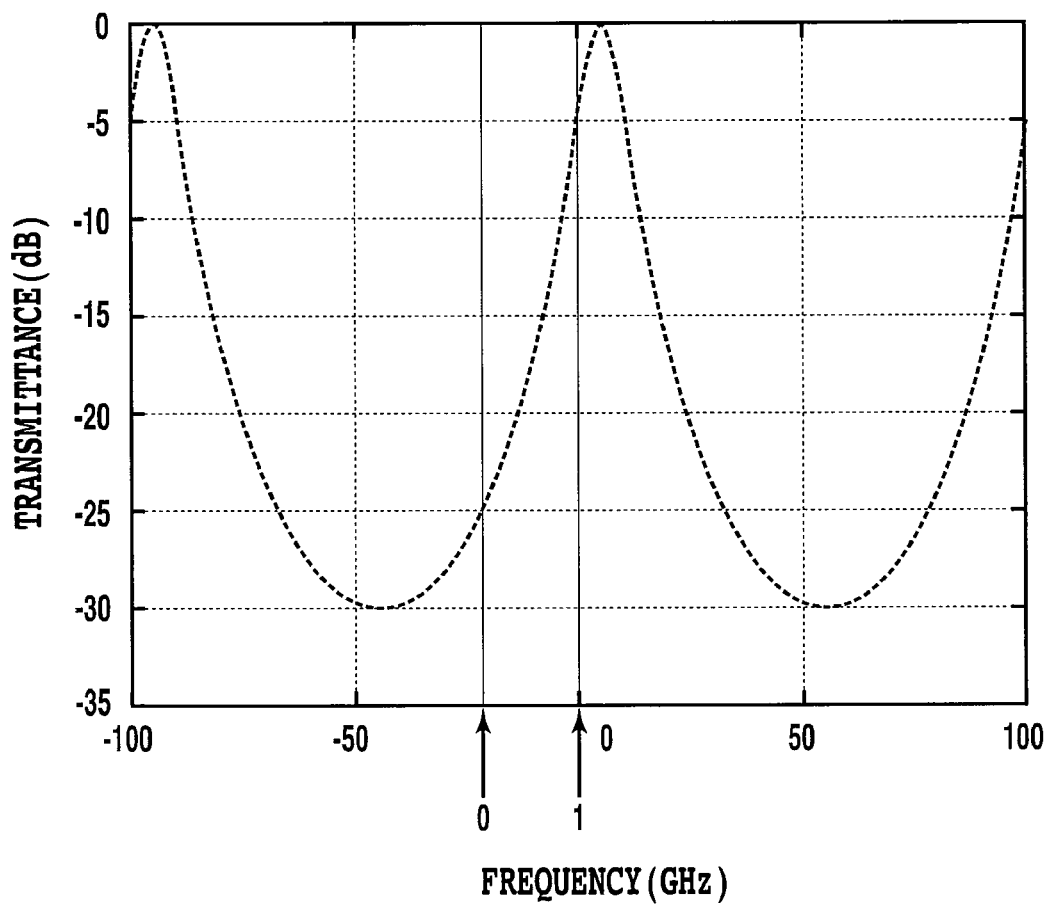
FIG. 9 is a diagram showing a frequency setting condition of the frequency filter according to the first embodiment.

FIG. 8 shows a transmission spectrum and a phase of the frequency filter according to the first embodiment. A phase change in addition to a intensity change is also generated in the vicinity of the transmission peak. FIG. 9 shows a frequency setting condition. A frequency corresponding to the NRZ signal of "1" is set to f GHz and a frequency corresponding to the NRZ signal of "0" is set to f−10 GHz. A transmission peak of the frequency filter is set to f+5 GHz. That is, a transmittance of the optical signal corresponding to the NRZ signal of "1" is higher than a transmittance of the optical signal corresponding to the NRZ signal of "0". Accordingly an intensity modulation signal can be generated in accordance with an input frequency modulation signal.

The output optical signal of the frequency filter 103 set in this way has a intensity component converted as shown in FIG. 5. It is found out that the frequency modulation signal is converted based upon the intensity modulation signal of NRZ by the frequency filter 103. In addition, the frequency component is converted as shown in FIG. 6. The optical signal before filter transmission has a frequency component in synchronization with the symbol sequence, but the optical signal after filter transmission has spread of a region in the vicinity of the frequency component of 0 GHz (hereinafter, referred to as flat chirp region). That is, it is found out that in a case of the symbol sequence of "1", the fluctuation is not generated in the vicinity of the frequency component of 0 GHz, and only in a case of the symbol sequence of "0", a large frequency fluctuation is generated. Accordingly, since the frequency fluctuation is restricted in a region where the optical signal exists corresponding to the symbol sequence of "1", the frequency fluctuation is not substantially generated, making it possible to restrict an influence of the dispersion of the optical fiber.

Figure 1:
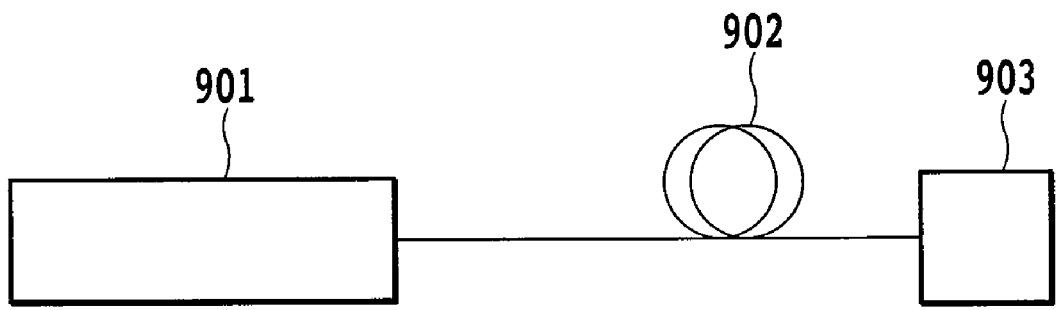
FIG. 1 is a diagram showing the construction of the conventional optical modulation signal transmitting system.
Figure 2:
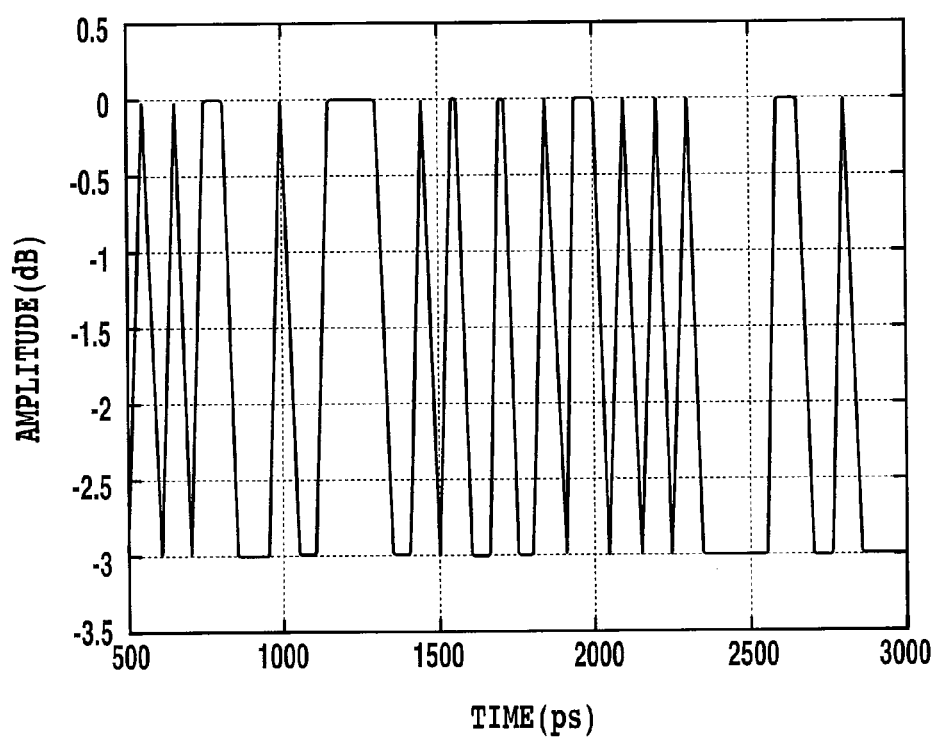
FIG. 2 is a diagram showing an NRZ signal outputted from a signal source of an optical modulation signal generating device.
Figure 3A:
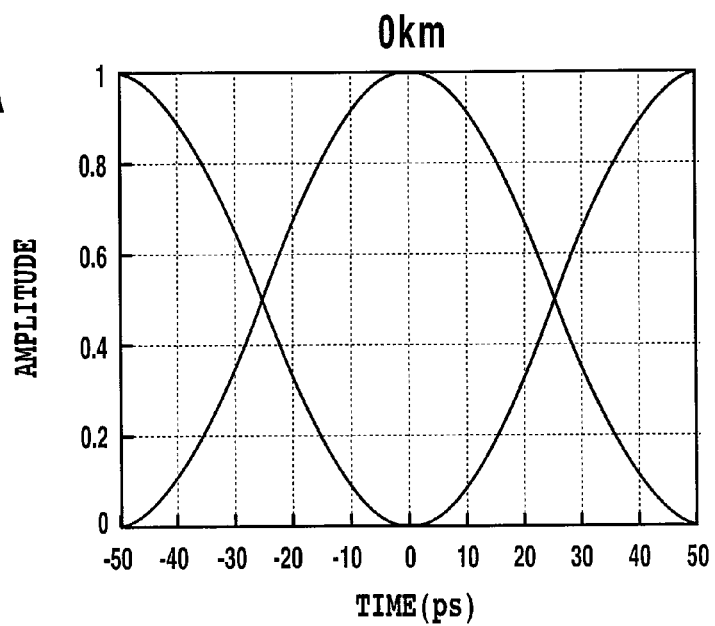
FIG. 3A is a diagram showing an eye opening of an optical signal modulated with an NRZ signal by a direct modulation system.
Figure 3B:
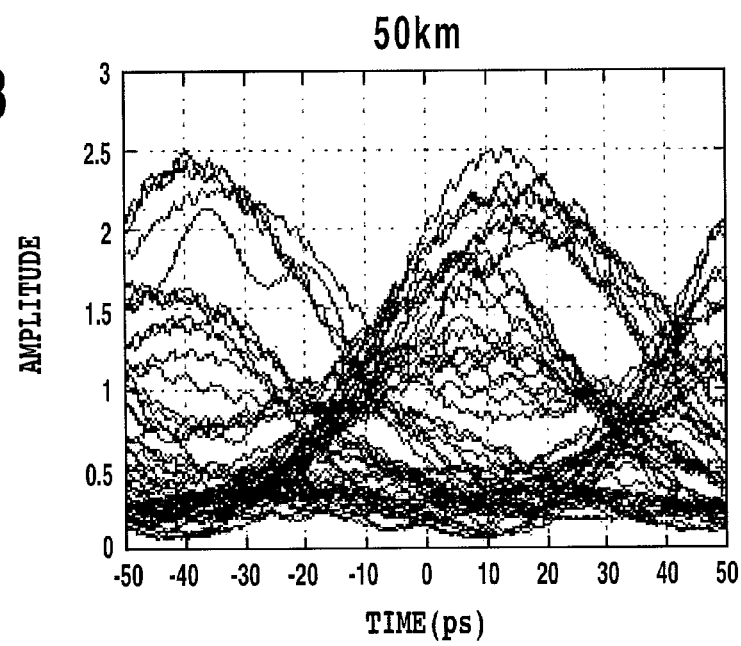
FIG. 3B is a diagram showing an eye opening at the time of propagating an optical signal through an optical fiber for 50 km by the direct modulation system.
Figure 10A:
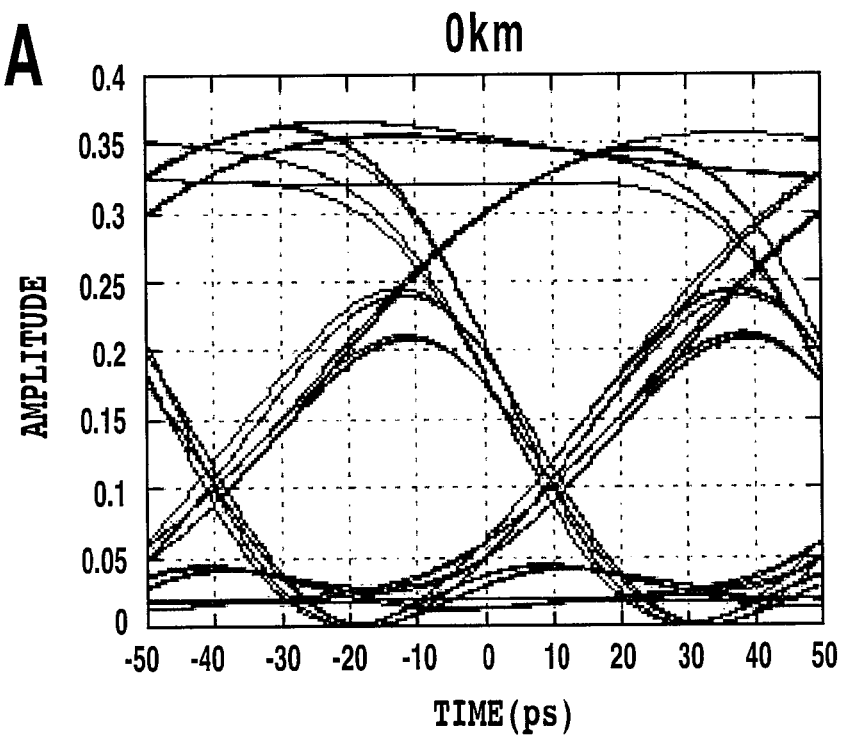
FIG. 10A is a diagram showing an eye opening of an optical signal outputted from an optical modulation signal generating device 101 according to the first embodiment.
Figure 10B:
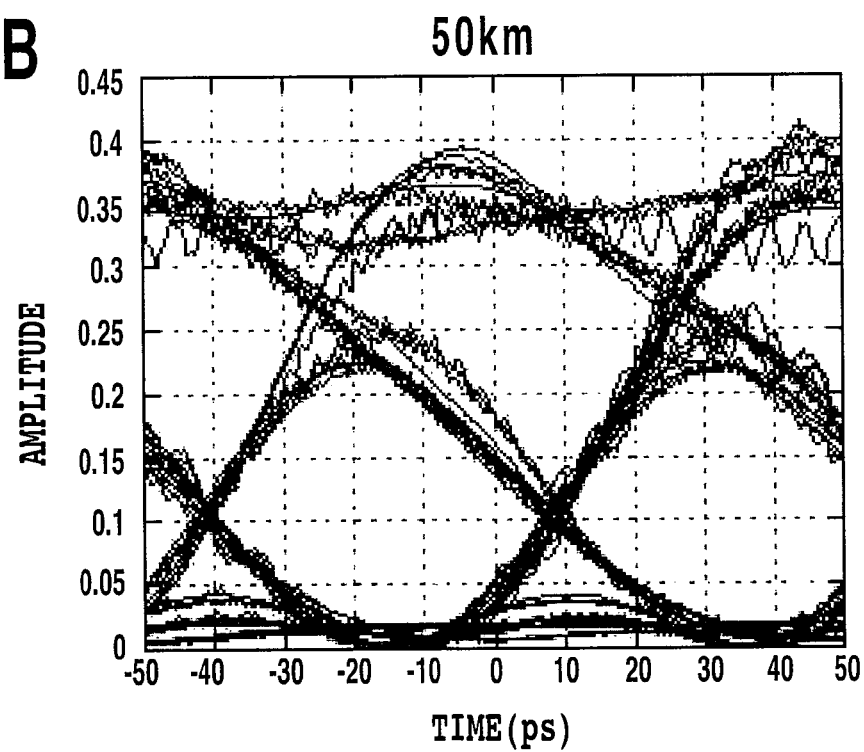
FIG. 10B is a diagram showing an eye opening at the time of propagating an optical signal through the optical fiber for 50 km by the optical modulation signal transmitting system according to the first embodiment.

FIG. 10A shows an eye opening of an optical signal outputted from the optical modulation signal generating device 101, and FIG. 10B shows an eye opening of an optical signal which propagates through the optical fiber 104 for 50 km and is received at the optical receiving device 105. A dispersion value of the optical fiber 104 is 16.3 ps/nm/km. Deterioration of the waveform is not caused even by propagation of the optical fiber of 50 km, and an improved effect is apparent as compared to the conventional technology shown in FIG. 3.

(Frequency Filter) Next, a principle is described that a signal of frequency modulation only and a frequency filter are used to be able to restrict a frequency fluctuation in an optical modulation signal. An input optical signal A(t) from the optical source 102 to the frequency filter 103 is expressed as follows. $\omega_0$ is a center frequency, t is a time parameter, θ is a phase fluctuation caused by modulation, and $A_0$ is an amplitude.

$$A(t) = A_0 \exp(i(\omega_0 t + \theta(t))) \quad (1)$$

The frequency fluctuation component is expressed as follows.

$$\Delta \omega(t) = \frac{d\theta(t)}{dt} \quad (2)$$

An amplitude component of a filter function is defined by a quadric function of a frequency and a phase component thereof is defined by a linear function of the frequency.

$$T(\omega) = T_r(\omega) \exp(i\theta(\omega)) = (a + b\omega + c\omega^2) \exp(i(d+e\omega))) \quad (3)$$

At this time a signal which has transmitted the frequency filter is added by a filter function for a Fourier conversion to obtain $$A_{out}(t) = \frac{1}{\sqrt{2\pi}} \int T(\omega) A(\omega) e^{i\omega t} d\omega. \quad (4)$$

A(ω) is a frequency component of an input optical signal. A signal which has transmitted the filter is divided into an amplitude component and a phase component as follows.

$$A_{out}(t) = |A_{out}(t)|e^{i\theta_{out}(t)} = |A_{out}(t)|e^{i\omega_0 t + i\theta(t) + i\theta_f(t)} \quad (5)$$

$$|A_{out}(t)| = \sqrt{\begin{array}{l}((a + b(\omega_0 + \theta) + c(\omega_0 + \theta)^2)A_0 - cA_0'')^2 + \\ ((b + 2c(\omega_0 + \theta))A_0' + c\theta' A_0)^2\end{array}} \quad (6)$$

$$\theta_f(t) = -\tan^{-1}\left(\frac{(b + 2c(\omega_0 + \theta'))A_0' + c\theta'' A_0}{(a + b(\omega_0 + \theta') + c(\omega_0 + \theta')^2)A_0 - cA_0''}\right) + d + e\omega \quad (7)$$

Since the frequency component is expressed by time differential of a phase, $$\omega_{out}(t) = \frac{d}{dt}[\omega_0 t + \theta(t) + \theta_f(t)] = \omega_0 + \frac{d\theta(t)}{dt} + \frac{d\theta_f(t)}{dt} \quad (8)$$

$$\omega_{out}(t) = \omega_0 + \frac{d\theta(t)}{dt} - \quad (9)$$
$$\frac{d}{dt}\left[\tan^{-1}\left(\frac{(b + 2c(\omega_0 + \theta'))A_0' + c\theta' A_0}{(a + b(\omega_0 + \theta') + c(\omega_0 + \theta')^2)A_0 - cA_0''}\right) + d + e\omega\right]$$

$$\omega_{out}(t) = \quad (10)$$
$$\omega_0 + \Delta\omega - \frac{\frac{d}{dt}\left(\frac{(b + 2c(\omega_0 + \Delta\omega))A_0' + c\Delta\omega' A_0}{(a + b(\omega_0 + \Delta\omega) + c(\omega_0 + \Delta\omega)^2)A_0 - cA_0''}\right)}{1 + \left(\frac{(b + 2c(\omega_0 + \Delta\omega))A_0' + c\Delta\omega' A_0}{(a + b(\omega_0 + \Delta\omega) + c(\omega_0 + \Delta\omega)^2)A_0 - cA_0''}\right)^2}$$

The above expressions include amplitude parameters a, b and c, and phase parameters d and e of the frequency filter. Therefore, by setting the filter function, that is, by setting the amplitude component and the phase component, control of the frequency modulation component is possible in addition to generation of the intensity modulation component.

As described above, the frequency of the optical signal corresponding to the NRZ signal of "1" is set in the vicinity of the transmission peak of the filter and the frequency of the optical signal corresponding to the NRZ signal of "0" is set from the frequency of the optical signal of the NRZ signal of "1" to a lower frequency side. The amplitude parameters a, b and c, and the phase parameters d and e may be set so that $\Delta\omega_f$ is within an allowable frequency fluctuation range, according to Expression (10). If $\Delta\omega_f$ is constant in all the time regions, that is, a time differential of $\Delta\omega_f$ is 0, the frequency can be constant in all the time regions.

In a case where an original optical signal has no intensity modulation component, since $A_o'(t)=0$ and $A_o''(t)=0$, the frequency modulation component $\Delta\omega_f$ of Expression (10) is $$\Delta\omega_f = \quad (11)$$
$$-\frac{\frac{d}{dt}\left(\frac{c\Delta\omega'}{a + b(\omega_0 + \Delta\omega) + c(\omega_0 + \Delta\omega)^2}\right)}{1 + \left(\frac{c\Delta\omega'}{a + b(\omega_0 + \Delta\omega) + c(\omega_0 + \Delta\omega)^2}\right)^2} = -\frac{\frac{d}{dt}\left(\frac{c\Delta\omega'}{T_r(\omega_0 + \Delta\omega)}\right)}{1 + \left(\frac{c\Delta\omega'}{T_r(\omega_0 + \Delta\omega)}\right)^2}.$$

According to Expression (11), it is found out that the amplitude parameter c of the frequency filter involves the frequency control.

Figure 11:
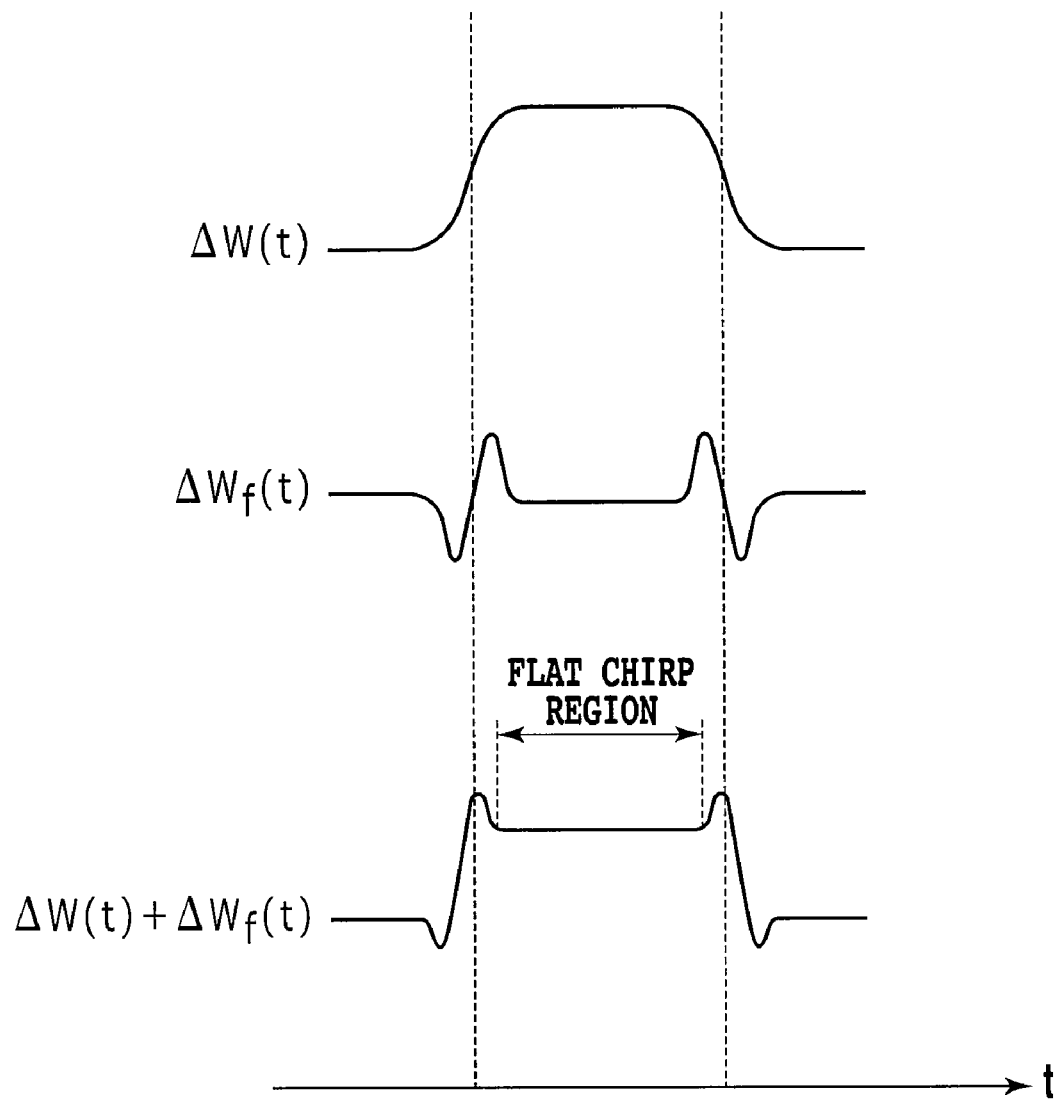
FIG. 11 is a diagram showing explaining restriction of a frequency fluctuation component by the frequency filter.

When the amplitude parameter c>0, the transmission function of the filter is, as shown in FIG. 9, a filter function formed in a convex shape downwards. By referring to FIG. 11, restriction of the frequency fluctuation component by the frequency filter is explained. A frequency modulation component Δω(t) before frequency filter transmission expresses a state across a bit of the symbol sequence of "1" of the waveform shown in a broken line in FIG. 6. A frequency component $\Delta\omega_f(t)$ is added to this state by the frequency filter to form a frequency modulation component $\Delta\omega(t)+\Delta\omega_f(t)$ after frequency filter transmission. That is, as explained in a solid line in FIG. 6, it is found out that a flat chirp region spreads corresponding to the symbol sequence of "1". In addition, when the amplitude parameter c>0, even if the transmission function of the filter has no dispersion compensation function, and specially frequency dependency of a delay time does not exist, there is an effect of being capable of restricting the frequency modulation component.

By thus putting the signal having only the frequency modulation component through the frequency filter in which parameters in regard to intensity and phase are adjusted, an intensity modulation signal can be generated. Further, the frequency modulation component contained in the signal can be controlled and restricted. That is, in a region where the optical signal exists corresponding to the symbol sequence of "1", the flat chirp region is expanded to restrict the frequency fluctuation, thereby causing the frequency fluctuation not to be substantially contained in the output optical signal.

Specially in the mirrors 203a to 203d in the frequency filter 103, a high refractive index layer of $Ta_2O_5$ and a low refractive index layer of $SiO_2$ are alternately laminated. Here, a reflectance of each of the mirrors 203a to 203d is set as 0.7. A thickness L of each of the resonators 202a and 202b interposed between them is determined by a gap of transmission peaks of etalon on an optical frequency axis and may be set as $$L=c/2/n/\text{FSR} \qquad (12).$$

Here, c is a light speed in a vacuum and n is a refractive index of a resonator. In a case of desiring that FSR equals 100 GHz, L may equal 1 mm. At this time, in regard to the respective parameters of the frequency filter according to the first embodiment, a=0.566, b=1.16×10$^{-11}$s, c=7.12×10$^{-23}$s$^2$, d=−0.490π, and e=−1.54×10$^{-11}$s between −10 GHz to 0 GHz of the frequency as the vicinity of an operation. Since c>0 in a range of this approximation, an effect of restricting the frequency fluctuation component is achieved.

Here, the frequency filter 103 is explained as a transmission type etalon filter, but may use a reflective type etalon filter. In addition, the similar effect can be obtained also by using the other type of filters. Further, there is shown an example in which the filters are connected in a two-step way, but the number of the filters may be one step or plural steps.

(Other Embodiment of Frequency Filter)
(a. Mach-Zehnder Interferometer)

FIG. 12A and FIG. 12B each show the construction of a frequency filter using the Mach-Zehnder Interferometer filter. The effect in the present invention can be obtained using also the Mach-Zehnder Interferometer filter. The Mach-Zehnder Interferometer filter shown in FIG. 12A is configured of an input light waveguide 701, a 2×2 optical coupler 702, two optical waveguides 703a and 703b having an optical path length difference therebetween to form a delay time τ, a 2×2 optical coupler 704, and an output light waveguide 705 in that order from an incident direction of light. A filter transmission characteristic can be adjusted by a coupling constant of the optical coupler and the delay time τ. In addition, a transmission slope of the filter can be adjusted by connecting the Mach-Zehnder Interferometer filters in a multiple-step way.

FIG. 12B shows a frequency filter in which the Mach-Zehnder Interferometer filters are connected in a two-step cascade connection. A transmission characteristic of Mach-Zehnder Interferometer filter has no dependency on frequency in the delay time by the filter and has no dispersion compensation function. However, if applied to the frequency filter in the first embodiment, dispersion tolerant transmission can be realized.

FIG. 13A and FIG. 13B each show an eye opening diagram when the frequency filter 103 using the Mach-Zehnder Interferometer filter is applied where an optical signal propagates through an optical fiber for 50 km. These diagrams are the simulation results in a case where a coupling constant of an optical coupler is 0.5 and a delay time τ is set so that FSR is 40 GHz. An input signal to the filter is an NRZ frequency modulation signal of a bit rate of 20 Gbps without intensity modulation. A frequency corresponding to the NRZ signal of "1" is set to f GHz and a frequency corresponding to the NRZ signal of "0" is set to f−10 GHz. The transmission peak of the Mach-Zehnder Interferometer filter is set to f+6 GHz. That is, the frequency modulation amplitude is 10 GHz. After the filter transmission, the optical signal propagates though the optical fiber having a dispersion value of 16.3 ps/nm/km for 50 km.

FIG. 13A shows an eye opening of an optical signal outputted from the optical modulation signal generating device 101 and FIG. 13B shows an eye opening of an optical signal which propagates through the optical fiber 104 for 50 km and is received at the optical receiving device 105. It is found out that deterioration of the waveform is not caused even in a case of optical fiber propagation of the optical signal for 50 km.

(b. Lattice Type Filter)

Figure 14A:
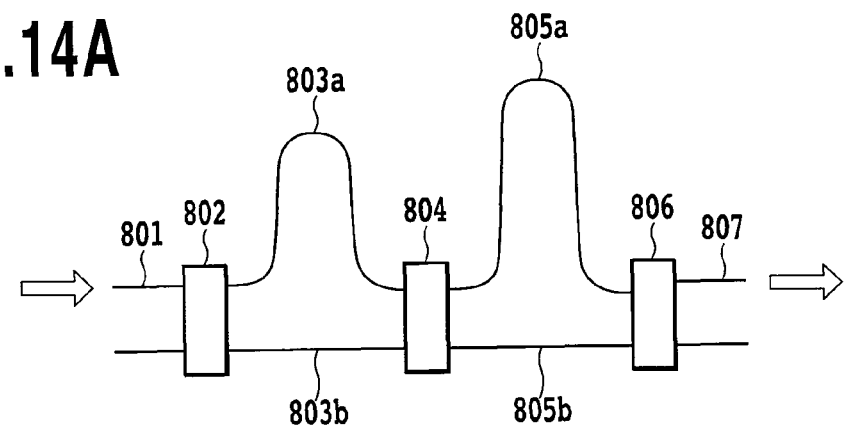
FIG. 14A is a diagram showing the construction of a frequency filter using a lattice type filter.
Figure 14B:
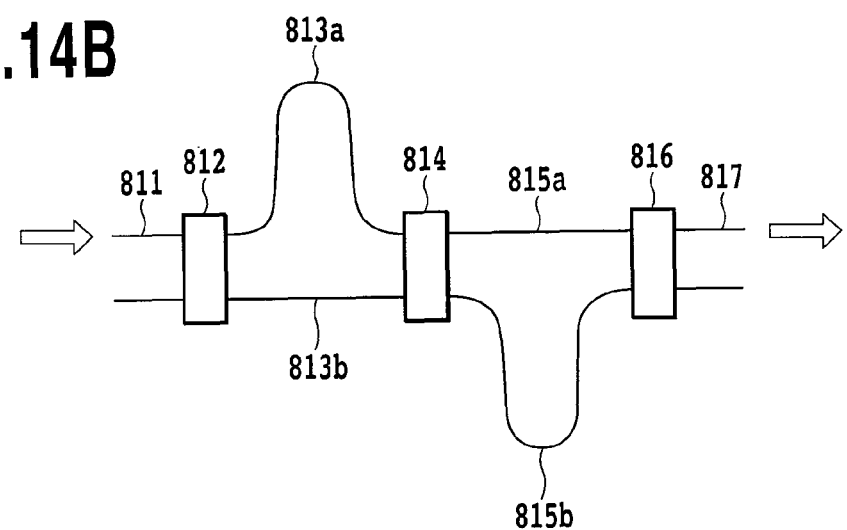
FIG. 14B is a diagram showing the construction of the frequency filter using the lattice type filter.
Figure 14C:
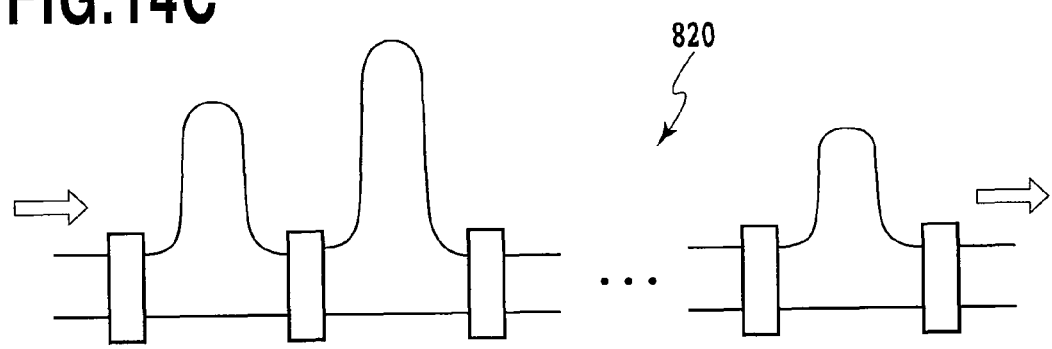
FIG. 14C is a diagram showing the construction of the frequency filter using the lattice type filter.

FIG. 14A to FIG. 14C each show the construction of a frequency filter using a lattice type filter. The effect of the present invention can be obtained even using the lattice type filter (for example, refer to Patent Document 1). The lattice type filter shown in FIG. 14a is filters of a two-step connection and is configured of an input light waveguide 801, a 2×2 optical coupler 802, two optical waveguides 803a and 803b having an optical path length difference therebetween to form a delay time τ1, a 2×2 optical coupler 804, two optical waveguides 805a and 805b having an optical path length difference therebetween to form a delay time τ2, a 2×2 optical coupler 806, and an output light waveguide 807 in that order from an incident direction of light. A transmission spectral characteristic can be adjusted by changing the coupling constant of the optical coupler and the optical path length difference between each step.

In regard to the optical path length difference, the delay may be, as shown in FIG. 14A, provided only in one of the optical waveguides or the optical waveguide having the delay may be, as shown in FIG. 14B, replaced at each step. In addition, as a lattice type filter 820 shown in FIG. 14C, filters are connected in a multiple-step way to improve a freedom degree in design, making it possible to realize transmission having high resistance to dispersion by the present invention.

FIG. 15A and FIG. 15B each show an eye opening diagram when the frequency filter 103 using the lattice type filter is applied where an optical signal propagates through the optical fiber for 50 km. These diagrams are the simulation results in a case where coupling constants of optical couplers 802, 804, and 806 respectively are 0.5, 0.7, and 0.1, a delay time τ1 is set so that FSR is 500 GHz and a delay time τ2 is set so that FSR is 50 GHz. An input signal to the filter is an NRZ frequency modulation signal of a bit rate of 20 Gbps without intensity modulation. A frequency corresponding to the NRZ signal of "1" is set to f GHz and a frequency corresponding to the NRZ signal of "0" is set to f−10 GHz. The transmission peak of the lattice type filter is set to f+30 GHz. That is, the frequency modulation amplitude is 10 GHz. After the filter transmission, the optical signal propagates in the optical fiber having a dispersion value of 16.3 ps/nm/km for 50 km.

FIG. 15A shows an eye opening of an optical signal outputted from the optical modulation signal generating device 101 and FIG. 15B shows an eye opening of an optical signal which propagates in the optical fiber 104 for 50 km and is received at the optical receiving device 105. It is found out that deterioration of the waveform is not caused even in a case of optical fiber propagation of the optical signal for 50 km. In addition, the lattice type filter has a dispersion compensation function. Therefore, the dispersion compensation is made by making the dispersion value in the transmission band of the optical filter a value in reverse to the dispersion value of the optical fiber, thereby making it possible to further dispersion tolerant transmission. It should be noted that not only the lattice type filter, but also any filter having wavelength dependency of dispersion, such as the etalon filter or the ring filter have the effect of the dispersion compensation.

(c. Coupled-Cavity Etalon Filter)

Figure 16A:
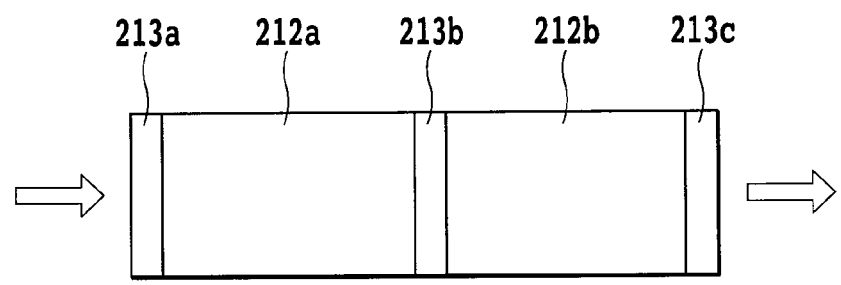
FIG. 16A is a diagram showing the construction of a frequency filter using a coupled-cavity etalon filter.
Figure 16B:
FIG. 16B is a diagram showing the construction of a frequency filter using the coupled-cavity etalon filter.

FIG. 16A and FIG. 16B each show the construction of a frequency filter using a coupled-cavity etalon filter. The effect of the present invention can be obtained even using the coupled-cavity etalon filter. The coupled-cavity etalon filter shown in FIG. 16A is configured of a mirror 213a, a resonator 212a, a mirror 213b, a resonator 212b, and a mirror 213c in that order from an incident direction of light. The transmission characteristic of the filter can be adjusted by a length of the resonator and a reflectance of the mirror. The coupled-cavity etalon filter shown in FIG. 16B is a coupled-cavity etalon filter in which two or more mirrors 223b and 223c are provided between two mirrors 223a and 223d.

Figure 17A:
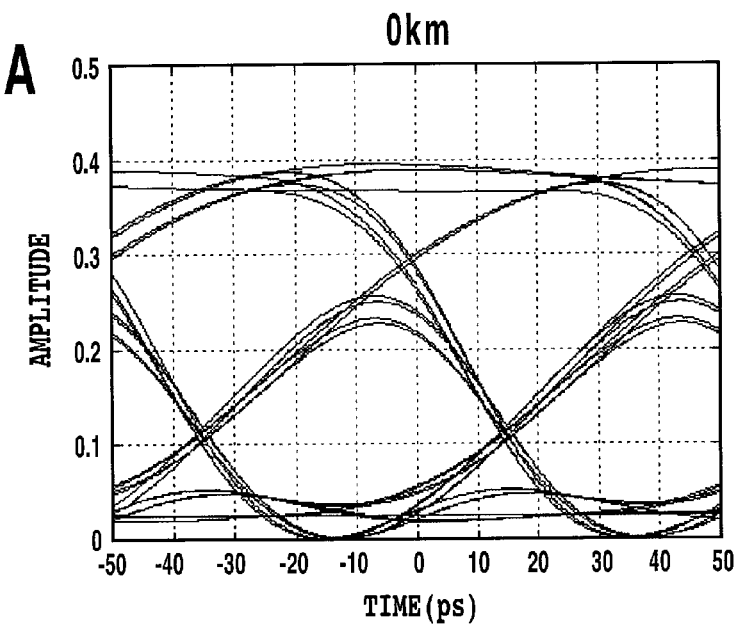
FIG. 17A is a diagram showing an eye opening of an optical signal outputted from the optical modulation signal generating device 101.
Figure 17B:
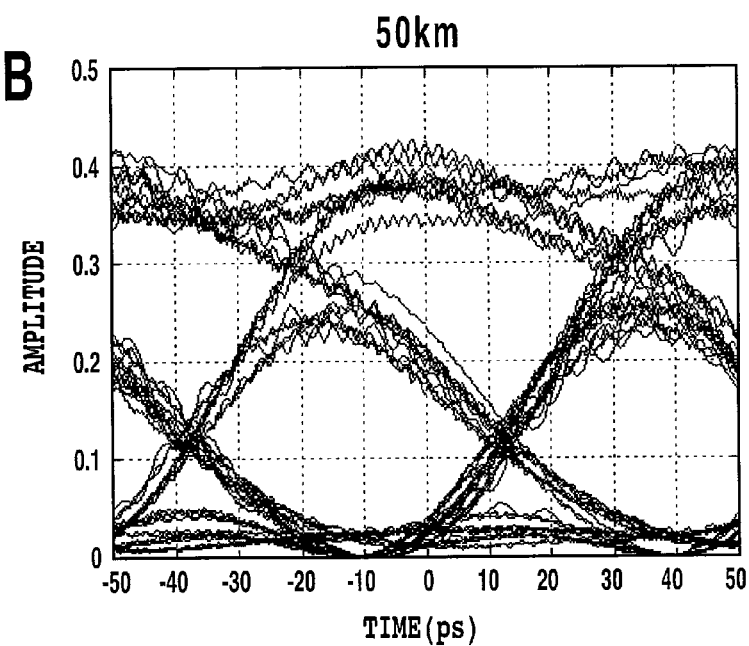
FIG. 17B is a diagram showing an eye opening at the time of propagating an optical signal through the optical fiber for 50 km by applying the frequency filter using the coupled-cavity etalon filter.

FIG. 17A and FIG. 17B each show an eye opening diagram when the frequency filter 103 using the coupled-cavity etalon filter is applied where an optical signal propagates through the optical fiber for 50 km. These diagrams are the simulation results in a case where in the construction in FIG. 16A, each reflectance of the mirrors 213a, 213b, and 213c is set to 0.75, 0.1, and 0.75 and a resonator length is adjusted to set FSR to 50 GHz. An input signal to the filter is an NRZ frequency modulation signal of a bit rate of 20 Gbps without intensity modulation. A frequency corresponding to the NRZ signal of "1" is set to f GHz and a frequency corresponding to the NRZ signal of "0" is set to f−10 GHz. The transmission peak of the coupled-cavity etalon filter is set to f+9.5 GHz. That is, the frequency modulation amplitude is 10 GHz. After the filter transmission, the optical signal propagates through the optical fiber having a dispersion value of 16.3 ps/nm/km for 50 km.

FIG. 17A shows an eye opening of an optical signal outputted from the optical modulation signal generating device 101 and FIG. 17B shows an eye opening of an optical signal which propagates in the optical fiber 104 for 50 km and is received at the optical receiving device 105. It is found out that deterioration of the waveform is not caused even in a case of optical fiber propagation of the optical signal for 50 km.

(d. Ring Resonator Filter)

Figure 18A:
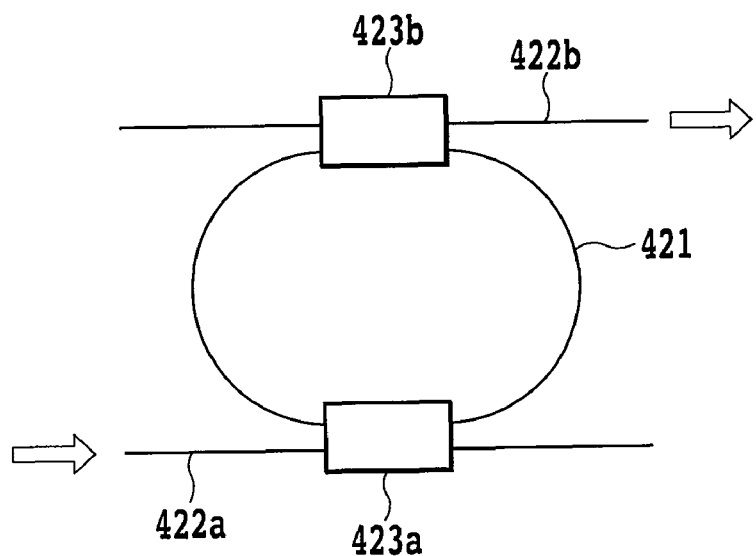
FIG. 18A is a diagram showing the construction of a frequency filter using a ring resonator type filter.
Figure 18B:
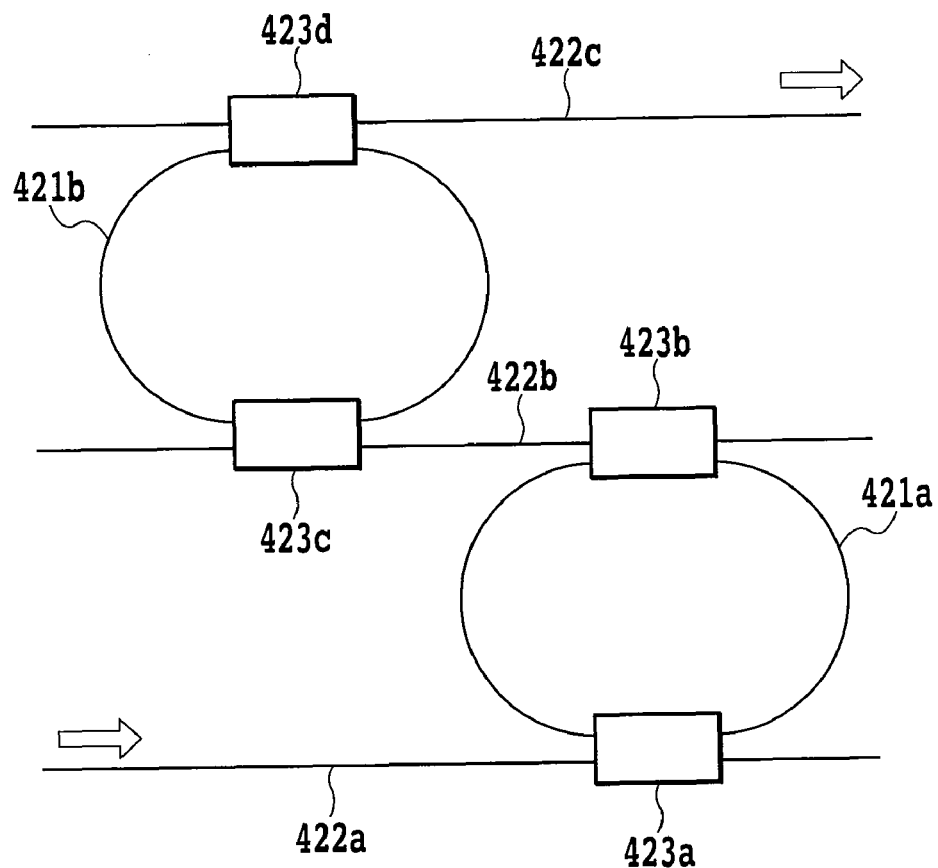
FIG. 18B is a diagram showing the construction of a frequency filter using the ring resonator type filter.

FIG. 18A to FIG. 18C each show the construction of a frequency filter using a ring resonator filter. The effect of the present invention shown in FIG. 18A can be obtained even using the ring resonator filter. The ring resonator filter shown in FIG. 18A is configured of an input light waveguide 422a, a 2×2 optical coupler 423a, a ring resonator 421, a 2×2 optical coupler 423b, and an output light waveguide 422b in that order from an incident direction of light. A transmission spectral characteristic can be adjusted by changing a coupling constant of the optical coupler and an optical path length of the ring resonator. The ring resonator filter shown in FIG. 18B is a frequency filter in which the ring resonator filters are connected in a two-step cascade connection.

The transmission having high resistance to dispersion by the present invention can be realized also by using such a ring resonator filter to the frequency filter 103 in the optical modulation signal generating device 101.

(Optical Source)

Figure 19A:
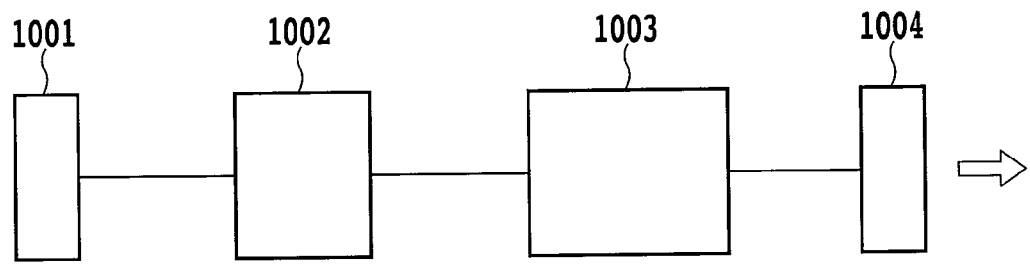
FIG. 19A is a diagram showing the construction of an optical source according to the first embodiment.
Figure 19B:
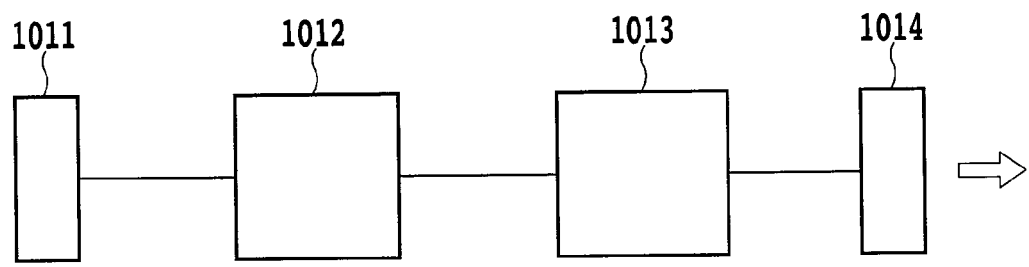
FIG. 19B is a diagram showing the construction of the optical source according to the first embodiment.
Figure 19C:
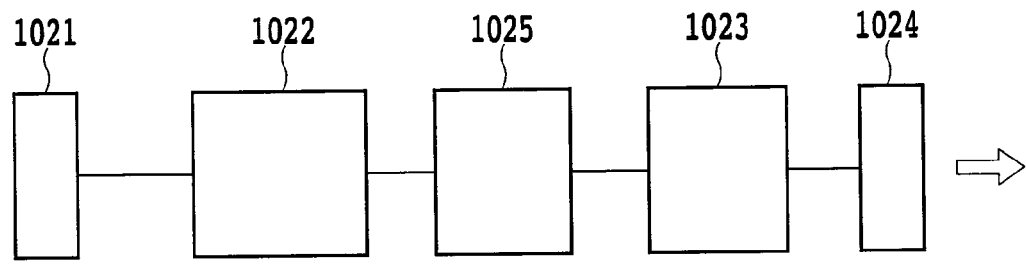
FIG. 19C is a diagram showing the construction of the optical source according to the first embodiment.

FIGS. 19A to 19C show the construction of the optical source according to the first embodiment. The optical source shown in FIG. 19A is configured so that a wavelength selective optical reflector 1001, a phase modulation region 1002, a gain region 1003 and an optical reflector 1004 are connected in that order, and the phase modulation region and the gain region are provided between the front and rear optical reflectors. The optical source 102 can generate only a high-speed frequency modulation signal without intensity modulation signal as described above. The gain region 1003 is a region having occurrence and an amplifying function of spontaneous emission light by optical injection or current injection. The spontaneous emission light generated in this region reciprocates between the front and rear optical reflectors 1001 and 1004 while being amplified by the gain region 1003. When losses and gains of the resonators between the optical reflectors 1001 and 1004 are balanced and the phase conditions are matched, the laser oscillation is generated. The phase-matched condition is expressed as follows when a length (entire resonator length) is L, an effective refractive index is $n_{eq}$, an optical wavelength is $\lambda$, an optical speed is c, and a frequency is f in the resonators between the optical reflectors 1001 and 1004.

$$1 = \exp\left(i2\frac{2\pi n_{eq}L}{\lambda}\right) = \exp\left(i2\frac{2\pi n_{eq}fL}{c}\right) \tag{13}$$

Accordingly, a lasing frequency f0 is expressed as follows.

$$f_0 = \frac{2cLn}{n_{eq}} m \text{ is integer} \tag{14}$$

Here, effective refractive indexes of all the resonators are set constant. Then, a single mode oscillation can be realized by selecting only one desired longitudinal mode by the wavelength selective optical reflector 1001. It should be noted that the wavelength selective optical resonator 1001 and the optical reflector 1004 in FIG. 19A may be replaced with each other. In addition, as shown in FIG. 19B, both of the front and rear optical reflectors may be wavelength selective optical reflectors 1011 and 1014.

A principle of the frequency modulation operation is as follows. The phase modulation region 1002 is a region having a function in which a refractive index of a medium freely changes. When the refractive index of the phase modulation region 1002 changes, the phase-matched condition changes so that a lasing frequency changes. A phase modulation region length is set to Lp and a refractive index changing quantity of the phase modulation region 1002 is set to $\Delta n_{eq}$. A changing quantity $\Delta f0$ of the lasing frequency at this time is as follows.

$$\Delta f_0 \sim f_0 \frac{\Delta n_{eq}L_p}{n_{eq}L} \tag{15}$$

Accordingly, a high-speed frequency modulation can be realized by modulating a refractive index in the phase modulation region 1002 at a high speed. For realizing efficient frequency modulation, it is effective to increase a refractive index changing quantity $\Delta n_{eq}/n_{eq}$ and a ratio $\Delta Lp/L$ of a phase adjusting region length Lp to all-resonator length L. In addition, as the other method, the frequency modulation can be performed by modulating a reflective peak frequency of the wavelength selective optical reflector 1001. In regard to adjustment of the lasing frequency, the reflective peak frequency of the wavelength selective optical reflector 1001 may be adjusted to a desired wavelength. In addition, as shown in FIG. 19C, a plurality of phase adjusting regions 1022 and 1025 are provided between front and rear reflective mirrors 1021 and 1024, wherein the frequency modulation can be performed at one phase adjusting region 1022 and fine adjustment of the lasing frequency can be carried out at the other phase adjusting region 1025.

Hereinafter, a principle in regard to a high-speed operation of the present invention will be briefly explained using expressions. An operation of the laser can be expressed using a rate equation.

$$\frac{dN}{dt} = \frac{I}{eV_a} - GS - \frac{N}{\tau_s} \quad (16)$$

$$\frac{dS}{dt} = GS - \frac{S}{\tau_p} + R_{sp}, \quad (17)$$

wherein N is a carrier concentration, S is a photon density, t is time, I is current, e is an electric charge, Va is an active layer volume, G is a gain, τs a photon life time, and $R_{sp}$ is a re-coupling rate. τs a photon life time in a resonator and is expressed as $$\frac{1}{\tau_p} = \frac{c}{n_{eq}L}\left(\xi_t \alpha_a L_a + \xi_t \alpha_p L_p + \xi_t \alpha_{DBR} L_{DBR} + \frac{1}{2}\ln\left(\frac{1}{R_1 R_2}\right)\right) \quad (18)$$

Herein, ξt is optical confinement of a waveguide, La is an active layer length, Lp is a phase adjusting region length, $L_{DBR}$ is an effective length of a reflective mirror, L is an effective length of all the laser resonators, αa is a propagation loss of an active layer, αp is a propagation loss of an phase adjusting region, $\alpha_{DBR}$ is a propagation loss of a reflective mirror region, and $R_1$ and $R_2$ respectively are each reflectance index of the front and rear reflectors. For simplification, effective refractive indexes of all the regions are assumed to be the same.

At this time, a lasing frequency of the laser is expressed using the following expression.

$$\frac{df}{dt} = -\frac{f_0}{n_{eq}L}\left(L_a \frac{dn_{eq}}{dN}\frac{dN}{dt} + L_p \frac{dn_{eq}}{dV}\frac{dV}{dt}\right) = \quad (19)$$

$$\frac{c\lambda\xi_t}{4\pi n_{eq}L}\left(L_a \alpha_{LEF} g' \frac{dN}{dt} - L_p \beta_c \frac{d\alpha_p}{dV}\frac{dV}{dt}\right)$$

Herein, f0 is a lasing frequency of the laser at non-modulating time, V is an applied voltage to a phase modulation region layer, $\alpha_{LEF}$ is a line width enhancement factor of an active layer, g' is a differential gain, and βc is a chirp parameter of a phase modulation layer. The first term in this expression shows that a carrier concentration in the active layer changes due to modulation and thereby an effective refractive index in a resonator changes so that a lasing frequency changes. The second term shows that by applying a voltage to a phase modulation region, a refractive index in a phase adjusting region changes so that a lasing frequency changes.

In consideration of modulating the phase modulation region with a voltage V, the lasing frequency changes according to Expression (19). Here, the second term includes a term of a time response dV/dt of a modulation voltage, but this term expresses a modulation signal itself. Therefore, this term is a frequency response in accordance with the modulation voltage. In an actual element, the response of the second term is degraded due to a resonator response of the element, which is in the extremely fast process as compared to the effect of the carrier fluctuation in the first term.

On the other hand, the first term includes a term dN/dt of a time response of a carrier. Since the response of the carrier is generally slow, such as several nanoseconds, this term is the cause of degradation of the frequency response. However, when this term is set to 0 or to be capable of being ignored to the second term, the first term does not contribute to the frequency response and the high-speed frequency modulation can be carried out in accordance with the second term.

Hereinafter, the frequency response characteristic will be more specially explained. The intensity modulation of optical output in the present embodiment can be obtained by converting a frequency modulation amplitude using the optical filter. Accordingly the frequency response characteristic can be evaluated by a frequency modulation width Δf in a case of applying a voltage amplitude ΔV at a modulation frequency f to the phase modulation region, that is, by modulation frequency f dependency of a relation expression of $$\frac{M(F)}{M(0)} = \frac{|\Delta f(f)/\Delta V(f)|}{|\Delta f(0)/\Delta V(0)|}. \quad (20)$$

As the frequency dependency of M(f)/M(0) is the smaller, the better modulation response characteristic can be obtained. A small signal response to a voltage can be obtained by solving Expressions 16 to 19 simultaneously, which is expressed by the following expression.

$$\frac{M(f)}{M(0)} = \frac{f_r^2}{f_r^2 - \frac{\Gamma_f}{(2\pi)^2}} \frac{\sqrt{\left(f^2 - f_r^2 - \frac{\Gamma_f}{(2\pi)^2}\right)^2 + f^2\left(\frac{\Gamma}{2\pi}\right)^2}}{\sqrt{(f^2 - f_r^2)^2 + f^2\left(\frac{\Gamma}{2\pi}\right)^2}} \quad (21)$$

Herein, fr is called a relaxation oscillation frequency of an element and Γ is called a dumping constant, which are respectively defined as follows.

$$f_r = \frac{1}{2\pi}\sqrt{\Gamma_N \Gamma_P + \Gamma_{NP}\Gamma_{PN}} \quad (22)$$

$$\Gamma = \Gamma_N + \Gamma_P \quad (23)$$

However, $$\Gamma_P = \frac{R_{sp}}{S_0} - \frac{\partial G}{\partial S}S_0 \quad (24)$$

$$\Gamma_N = \frac{\partial G}{\partial N}S_0 + \frac{\partial}{\partial N}\left(\frac{1}{\tau_s}\right)N_0 + \frac{1}{\tau_s} \quad (25)$$

$$\Gamma_{PN} = \frac{\partial G}{\partial N}S_0 + \frac{\partial R_{sp}}{\partial N} \quad (26)$$

$$\Gamma_{NP} = G + \frac{\partial G}{\partial S}S_0 \quad (27)$$

$S_0$ is a photon density in a steady state, and $\Gamma_f$ is called a constant determining a frequency response, which is defined as follows.

$$\Gamma_f = \xi_t \frac{c}{n_{eq}} \frac{\partial \alpha_p}{\partial V} \frac{L_a}{L} \frac{\frac{\partial n_a}{\partial N}}{\frac{\partial n_p}{\partial V}} \left( G + \frac{\partial G}{\partial S} S_0 \right) \quad (28)$$

When $\Gamma_f$ comes close to 0, a value of Expression 21 becomes 1 and a response of the element is constant regardless of the modulation frequency, obtaining a high-speed frequency response. At this time, a point that the response of the element has no relation with the relaxation oscillation frequency of the element is an excellent feature as compared to the direct modulation method.

Figure 20:
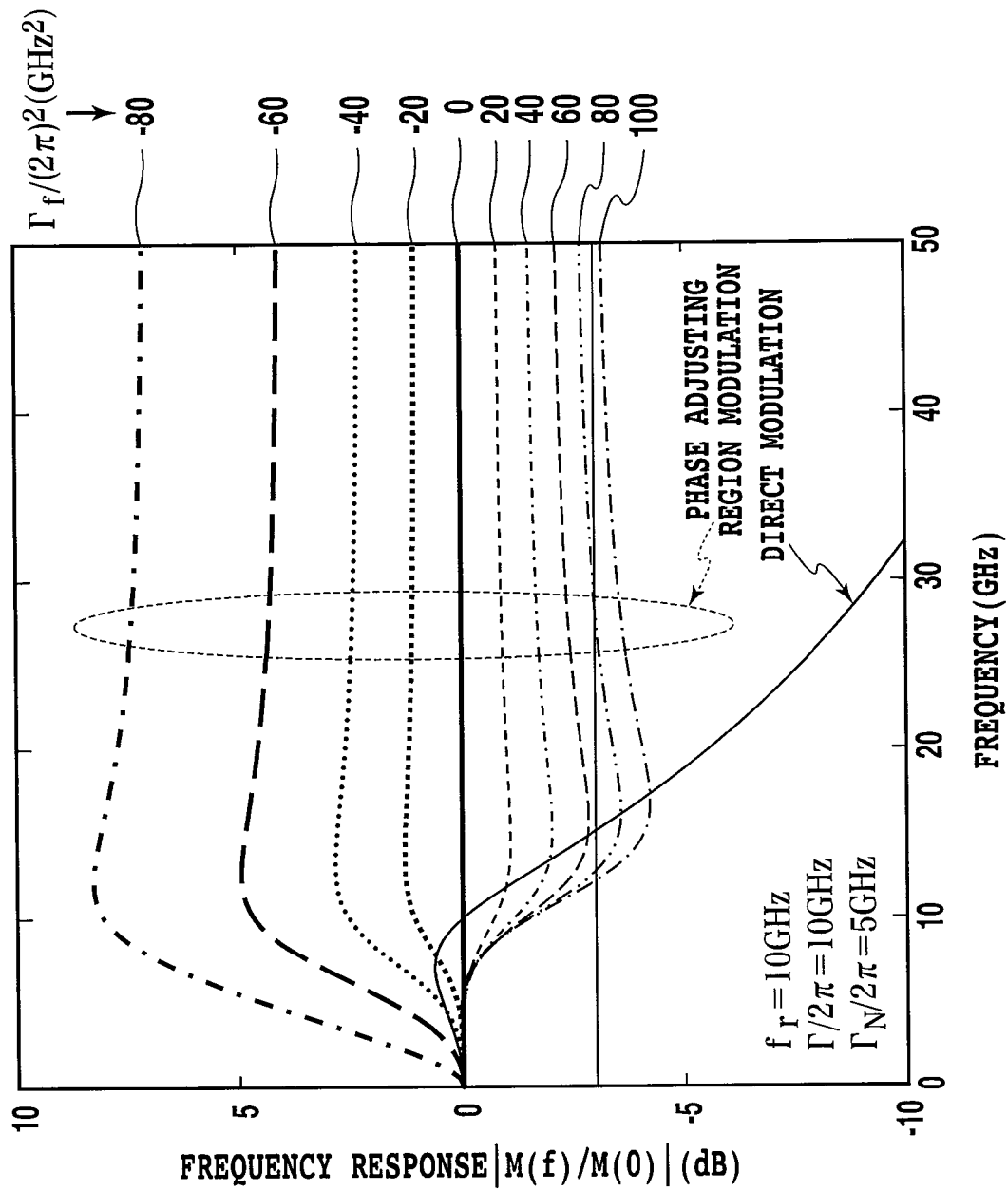
FIG. 20 is a diagram showing frequency response characteristics of the optical source according to the first embodiment.

FIG. 20 shows frequency response characteristics. A lateral axis shows modulation frequencies f, and a longitudinal axis shows frequency responses according to Expression 21 in a decibel display. In addition, for comparison with the conventional technology, a case of the direct modulation system is shown simultaneously. The frequency response characteristic in a case of the direct modulation is defined by a changing quantity $\Delta s$ of a photon density to a current modulation amplitude $\Delta I$, that is, $$\frac{M(f)}{M(0)} = \frac{|\Delta S(f)/\Delta I(f)|}{|\Delta S(0)/\Delta I(0)|}. \quad (29)$$

In this case, by using Expressions 16 and 17, the following expression generally known is introduced.

$$\frac{M(f)}{M(0)} = \frac{f_r}{\sqrt{(f^2 - f_r^2)^2 + f^2 \left(\frac{\Gamma}{2\pi}\right)^2}} \quad (30)$$

In FIG. 20, $f_r$ is set to 10 GHz, $\Gamma/2\pi$ is set to 10 GHz, and $\Gamma_f/2\pi$ is set to 5 GHz. In a case of the direct modulation, the frequency response shows a peak value in the vicinity of 10 GHz of the relaxation oscillation frequency fr, and is rapidly degraded at a frequency higher than it. On the other hand, in a case of the phase region modulation, a peak of degradation of the frequency response exists, but it has a flat frequency response characteristic to the high frequency region. Accordingly, by restricting the degradation in the peak frequency, it is possible to perform a high-speed modulation operation. Specially by making $\Gamma_f$ close to 0, a frequency response which does not depend on the relaxation oscillation frequency can be realized. For this realization, the flowing method may be adopted according to Expression 28. (1) To make an increase in absorption loss due to voltage application close to 0, that is, to make $\partial \alpha_p/\partial N$ close to 0. (2) To make a refractive index change of an active layer due to an increase in carrier concentration, that is, $\partial n_a/\partial N$ close to 0, that is, to make a line width enhancement factor $\alpha_{LEF}$ of an active layer close to 0. As a measurement for realizing the response, it may be alright if a value of Expression (21) is within 3 dB in a range of a desired modulation frequency. Ideally by making $\Gamma_f$ to 0, the frequency response which does not depend completely on the relaxation oscillation is possible.

Here, the above (1), that is, an embodiment for making an increase in absorption loss due to voltage application close to 0 will be shown. In the present embodiment, the cause by which the absorption loss changes at voltage modulating is composed mainly of two points. One is a change of the absorption loss $\alpha p$ due to voltage application in the phase modulation region, and the other is a change by wavelength dependence of reflectances $R_1$ and $R_2$ of the reflective mirrors. In consequence, a changing quantity of the reverse number in a photon lifetime at modulating is expressed as $$\Delta \frac{1}{\tau_p} = \frac{c}{n_{eq}L} \left( \xi_t \Delta \alpha_p L_p + \Delta \left( \frac{1}{2} \ln \left( \frac{1}{R_1 R_2} \right) \right) \right). \quad (31)$$

By maintaining this value to be constant, the entire oscillation losses can be maintained to be constant whereby the optical output can be maintained to be constant and at the same time, the high-speed frequency modulation can be realized.

(Specific Example of Optical Source)

Figure 21:
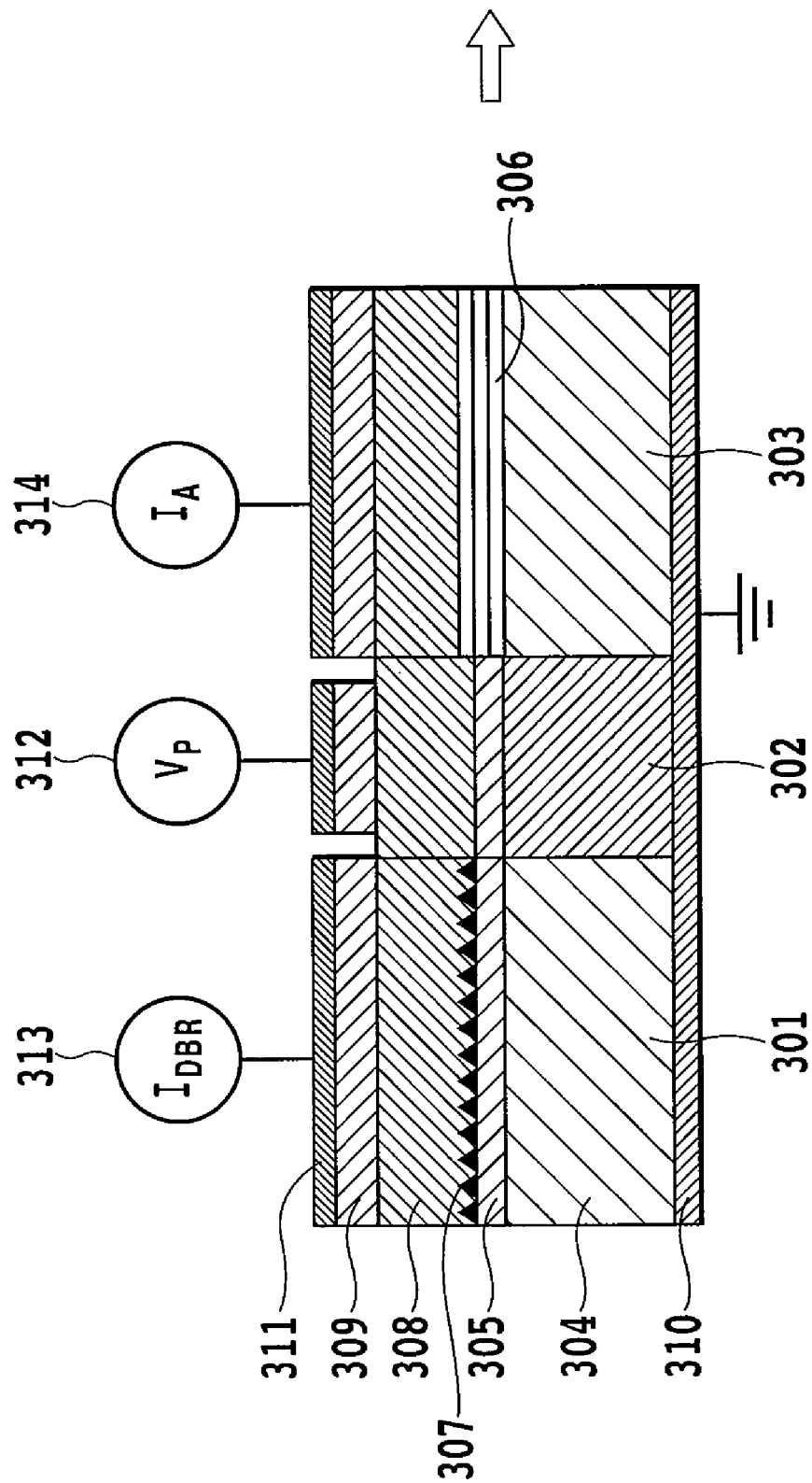
FIG. 21 is a diagram showing the specific construction of the optical source according to the first embodiment.

FIG. 21 shows the special construction of the optical source according to the first embodiment. The optical source 102 is a distributed Bragg reflector laser (DBR-LD) including a distributed Bragg reflector mirror (DBR) region 301, a phase adjusting region 302 and an active layer region 303 toward an exit direction of light. A structure of the optical source 102 in a vertical direction is configured so that a waveguide layer 305 of the DBR region 301 and the phase adjusting region 302, and a quantum well layer 306 in the active layer region 303 are laminated on a n-type cladding layer 304. A diffraction grating 307 is provided in the waveguide layer of the DBR region 301. A p-type cladding layer 308, a contact layer 309, and a p-side electrode 311 are laminated on these layers. In addition, a n-side electrode 310 is provided under the n-type cladding layer 304.

A phase adjusting voltage controller 312 is connected to the phase adjusting region 302, a lasing wavelength controlling current device 313 is connected to the DBR region 301, and an active layer current controller 314 is connected to the active layer region 303. By injecting current into the active layer region 303, spontaneous emission light is reflected between an ejection-side end face of the active layer region 303 and the DBR region 301 to be feed-backed and oscillates in a point of exceeding a threshold value. The lasing wavelength can be adjusted by lasing wavelength controlling current in the DBR region 301 as the wavelength selective type filter region.

Figure 22A:
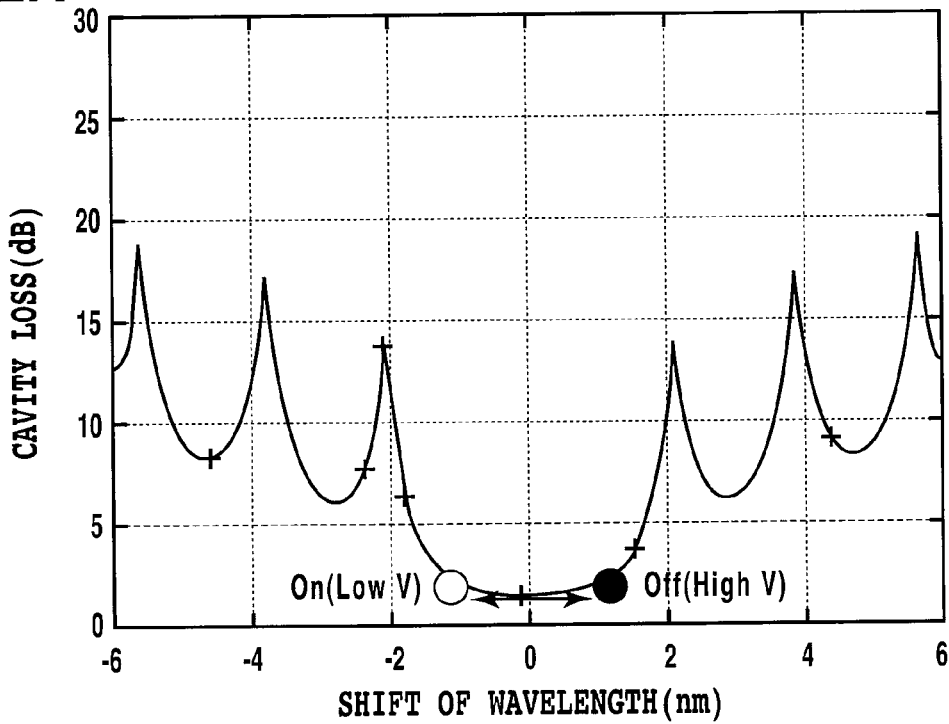
FIG. 22A is a diagram showing resonator characteristics of the optical source according to the first embodiment.
Figure 22B:
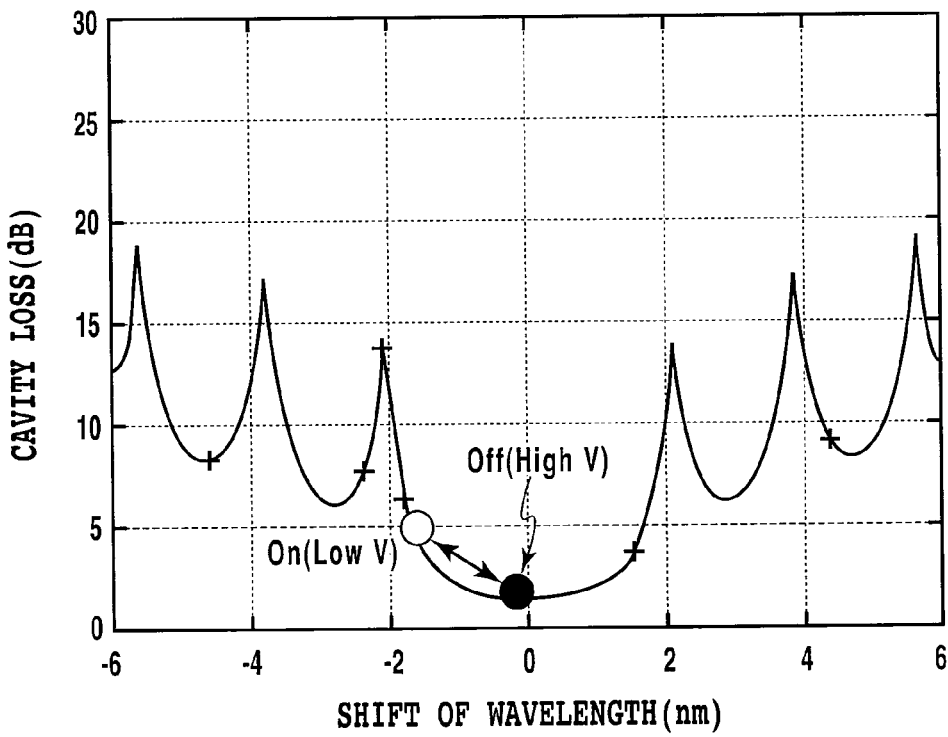
FIG. 22B is a diagram showing resonator characteristics of the optical source according to the first embodiment.

FIG. 22A and FIG. 22B each show resonator characteristics of the optical source according to the first embodiment. A lateral axis shows a shift of the DBR region 301 from a Bragg wavelength and a longitudinal axis shows a resonator loss. "+" marks show points corresponding to longitudinal modes. As shown in "○" mark in FIG. 22A, a phase adjusting voltage in the phase adjusting region 302 and lasing wavelength controlling current in the DBR region 301 are set so that the oscillation mode is in the vicinity of the center in the Bragg wavelength. In a case where the phase adjusting region 302 is of a bulk structure, when a voltage is applied, the refractive index changes due to an electro-optic effect, mainly due to a Pockels effect and a Franz-Keldysh effect. In a case where the phase adjusting region 302 is a quantum well layer, when a voltage is applied, the refractive index changes mainly by the Pockels effect and the QCSE effect. At this time, the oscillation mode changes, as shown by "●" mark in FIG. 22A, to a long wavelength side to a Bragg wavelength center, that is, a low frequency side. By making a state where the phase adjusting voltage is low corresponds to the NRZ signal of "1" and by making a state where the phase adjusting voltage is applied corresponds to the NRZ signal of "0", the frequency modulation signal shown in FIG. 5 can be generated. In a case where a change of the waveguide loss due to the modulation can be ignored, by performing the frequency modulation around the Bragg wavelength as shown in FIG. 22A, occurrence of the intensity modulation can be restricted. Accordingly, as described above, at this time the response of the laser is determined by the response in the resonator, that is, only by the photon lifetime in the resonator and thereby the high-speed modulation of 10 GHz or more exceeding the relaxation oscillation frequency can be performed.

FIG. 22B shows another operation condition in a case where a change of the waveguide loss is generated due to an electric field application. The phase adjusting voltage in the phase adjusting region 302 and the lasing wavelength controlling current in the DBR region 301 are set so that an oscillation mode is in a short-wavelength side to the Bragg wavelength. In the resonator characteristic, due to wavelength dependency of a DBR reflective spectrum, specifically at electric field applying, the waveguide loss of the phase adjusting region 302 increases. When the waveguide loss changes at modulating as described above, a threshold value gain of the laser changes. Therefore, since a carrier concentration in the active layer changes and simultaneously the laser output changes, the intensity modulation is generated. At this time, since a response of the laser in the intensity modulation is restricted by the relaxation oscillation frequency, the modulation speed is restricted to the order of 10 GHz. On the other hand, as in a case of the aforementioned drive condition, if the wavelength dependency of the oscillation spectrum is set to a state where a loss at a low voltage is higher than a loss at a high voltage, the threshold value gain in the resonator at electric field modulating does not change. That is, since the intensity change does not occur at electric-filed modulating in this construction, it is possible to generate only the frequency modulation component. Accordingly, as described above, the response of the laser is determined by the response in the resonator, that is, only by the photon lifetime in the resonator and thereby the high-speed modulation of 10 GHz or more exceeding the relaxation oscillation frequency can be performed.

Second Embodiment

Figure 23:
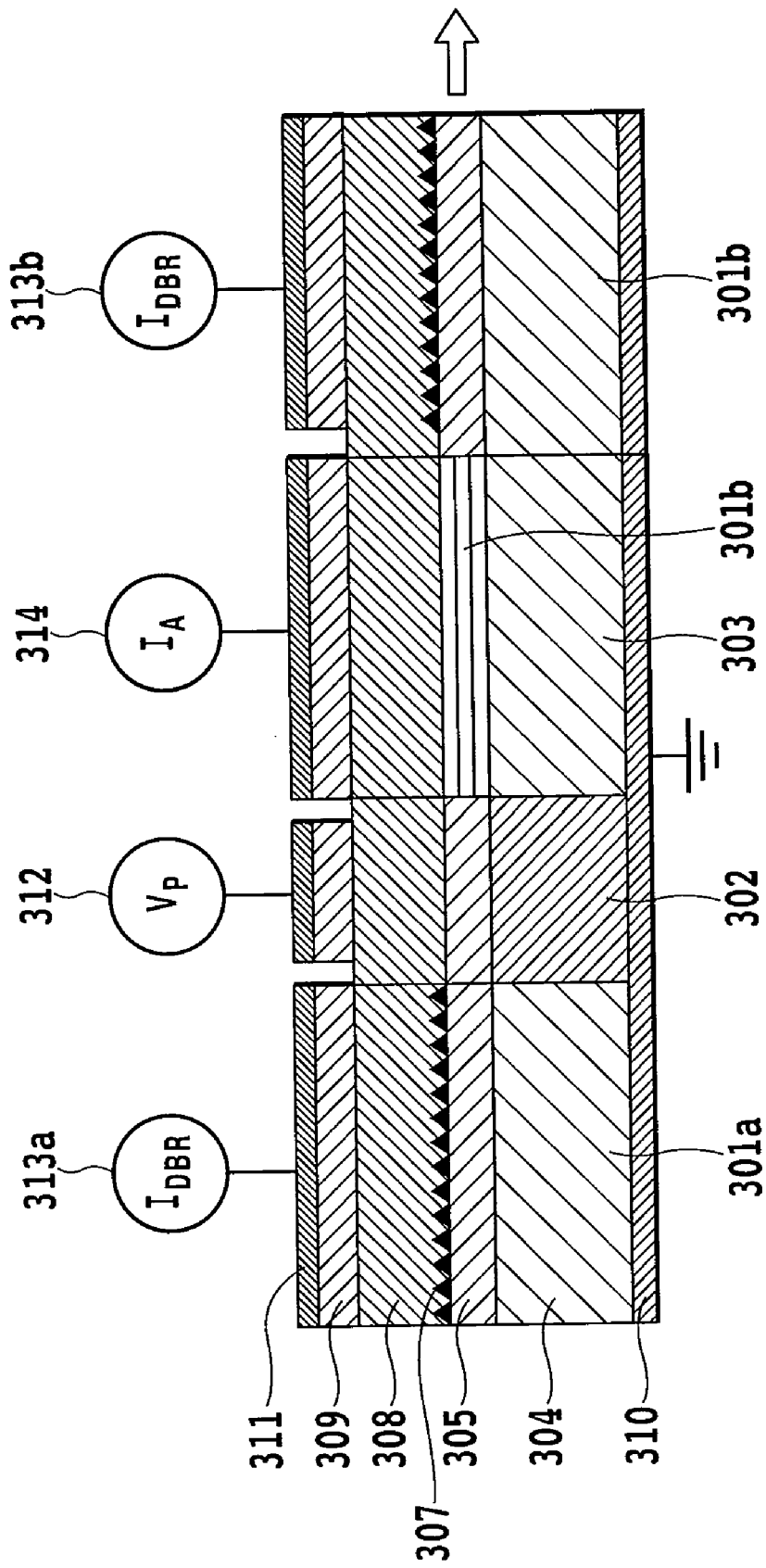
FIG. 23 is a diagram showing the specific construction of an optical source according to a second embodiment.

FIG. 23 shows the specific construction of an optical source according to a second embodiment. The optical source 102 is a distributed Bragg reflector laser including a DBR region 301a, the phase adjusting region 302, the active layer region 303, and a DBR region 301b toward an exit direction of light. The similar effect can be obtained even in the construction where the DBR region exists in both sides of the active layer and the phase adjusting region.

It should be noted that in the first and second embodiments, the adjustment of the lasing frequency can be realized even by a voltage drive in the DBR regions 301a and 301b. The similar effect can be obtained by voltage-driving the DBR regions 301a and 301b with lasing wavelength controlling voltage devices 313a and 313b.

Third Embodiment

Figure 24:
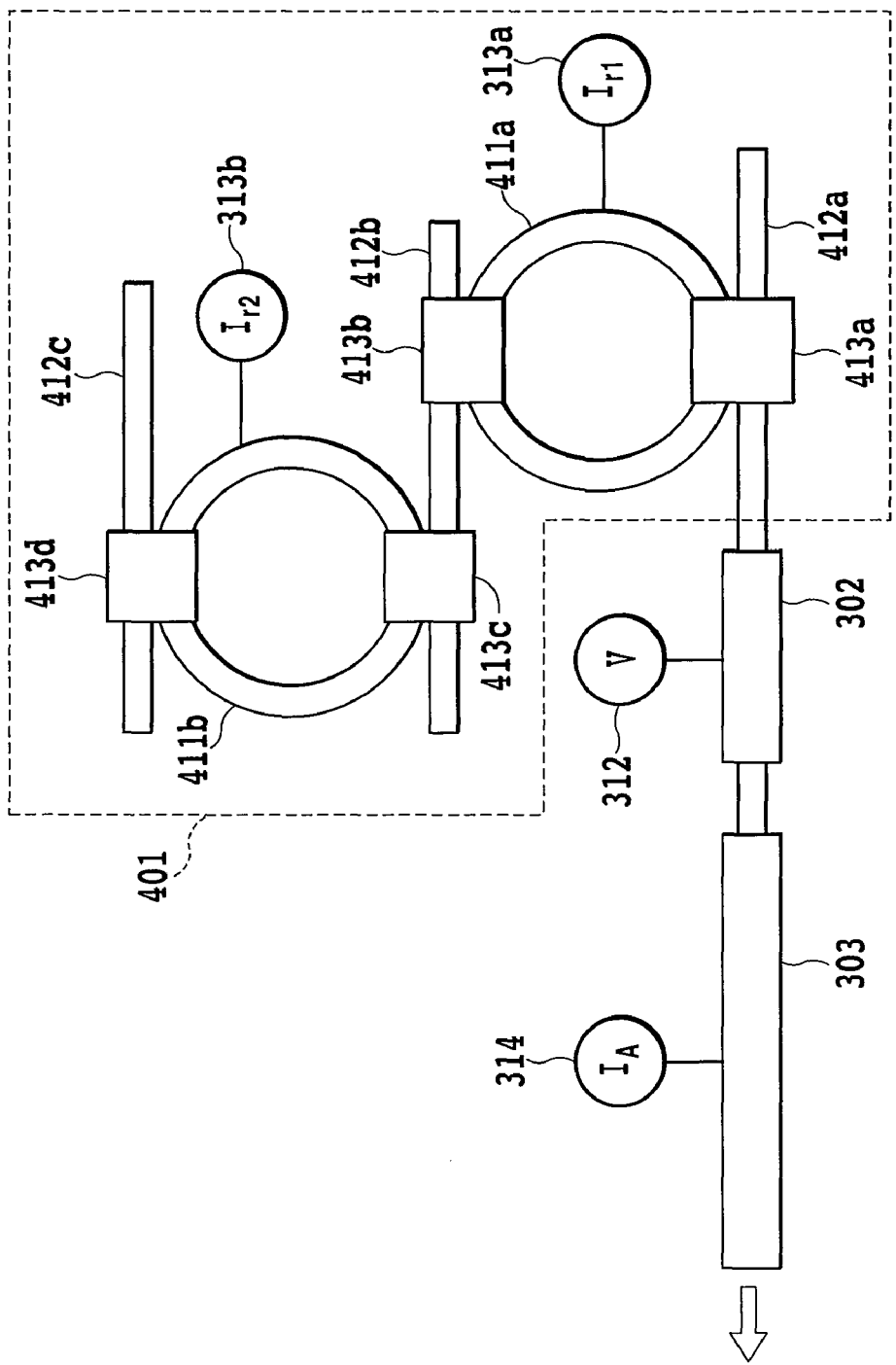
FIG. 24 is a diagram showing the specific construction of an optical source according to a third embodiment.

FIG. 24 shows the specific construction of an optical source according to a third embodiment. The optical source 102 includes a coupled ring filter region 401, the phase adjusting region 302, and the active layer region 303 toward an exit direction of light. As similar to the first embodiment, the active region 303 is formed of a multiple quantum well layer and the phase adjusting region 302 is formed of a bulk or a quantum well waveguide layer.

The coupled ring filter region 401 includes a ring resonator 411a having a ring diameter of FSR 600 GHz and a ring resonator 411b having a ring diameter of FSR 700 GHz. The phase adjusting region 302 and the ring resonator 411a are coupled via a waveguide 412a by a 2×2 coupler 413a having a coupling constant of 0.5. The ring resonator 411a and the ring resonator 411b are coupled via a waveguide 412b by 2×2 couplers 413b and 413c each having a coupling constant of 0.5. Further, the ring resonator 411b is coupled to the waveguide 412c by a 2×2 coupler 413d having a coupling constant of 0.5. The lasing wavelength controlling current devices 313a and 313b are respectively connected to the ring resonator 411a and the ring resonator 411b.

Since a single ring resonator has a periodical transmission spectrum, an entire transmission spectrum by overlapping amounts to 4200 GHz. Because of the transmission spectrum having FSR wider as compared to the gain band, it is possible to select a single oscillation mode. Accordingly, in the same way as the first embodiment, the laser oscillation is performed by injection current into the active layer region 303 from the active layer current controller 314, and the lasing wavelength is controlled with current injection from the lasing wavelength controlling current devices 313a and 313b. Further, the electric-filed control in the phase adjusting region 312 causes the high-speed frequency modulation to be performed, realizing the long-distance transmission. It should be noted that the adjustment of the lasing frequency can be realized even by a voltage drive in the ring resonator.

Fourth Embodiment

Figure 25:
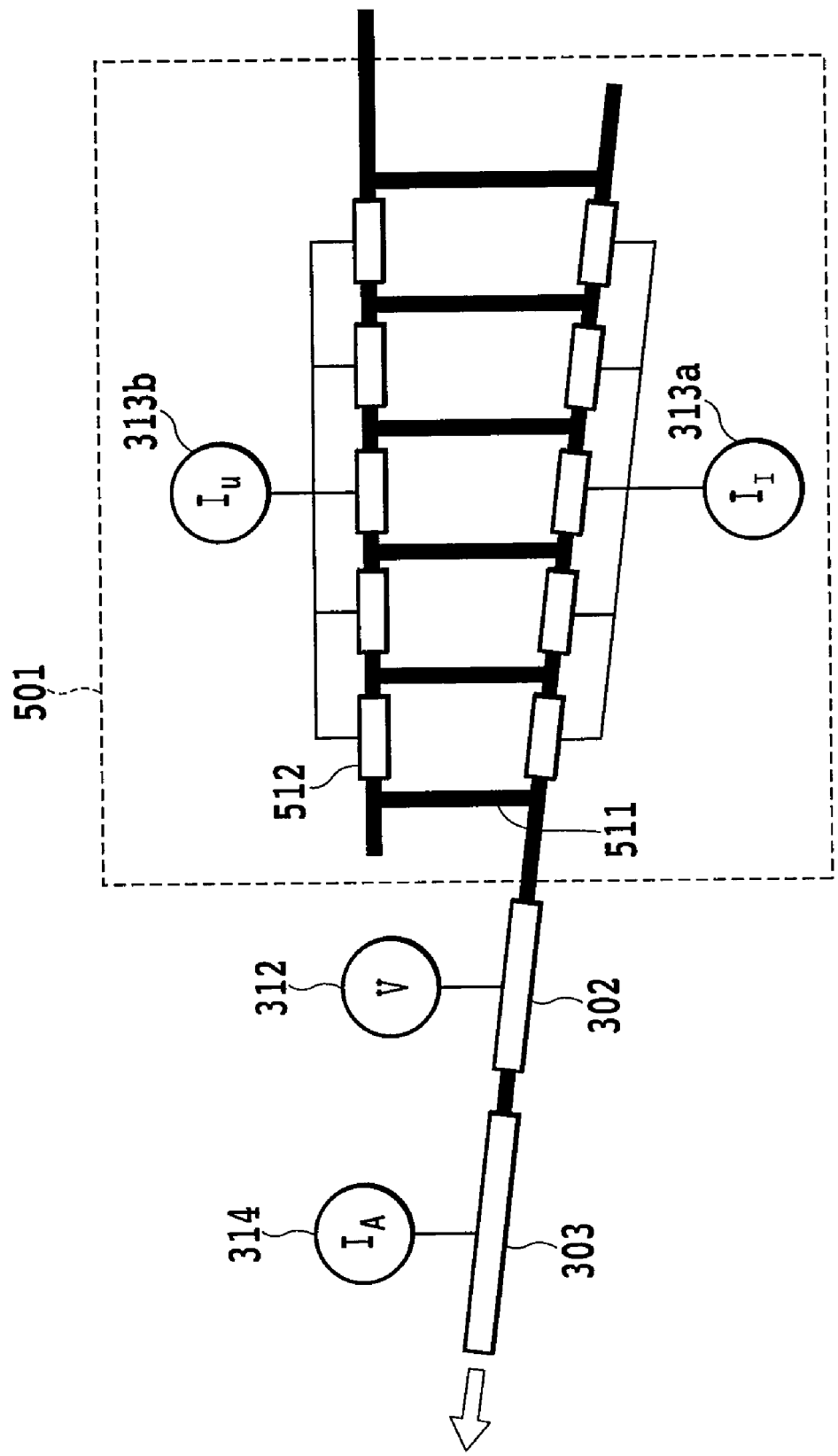
FIG. 25 is a diagram showing the specific construction of an optical source according to a fourth embodiment.

FIG. 25 shows the specific construction of an optical source according to a fourth embodiment. The optical source 102 includes a ladder filter region 501, the phase adjusting region 302, and the active layer region 303 toward an exit direction of light. In the same way as the first embodiment, the active region 303 is formed of a multiple quantum well layer and the phase adjusting region 302 is formed of a bulk or a quantum well waveguide layer.

In the ladder filter region 501, both ends of each of a plurality of waveguides 511 each having a different optical path length respectively are connected to two waveguides in a ladder shape and there is an optical path difference between the neighboring waveguides. Since an interference is generated by this optical path difference, a transmission spectrum having wavelength selective performance can be obtained by combining the transmission spectrum of each waveguide. Electrodes 512 are fabricated in the upward and downward waveguides and the lasing wavelength controlling current devices 313a and 313b respectively are connected to each of the upward and downward electrodes. The lasing wavelength can be controlled by injecting current to this electrode.

In the same way as the first embodiment, the laser oscillation is caused by injection current to the active layer region 303 from the active layer current controller 314, and the lasing wavelength is controlled with current injection from the lasing wavelength controlling current devices 313a and 313b. Further, the electric-filed control in the phase adjusting region 312 causes the high-speed frequency modulation to be performed, realizing the long-distance transmission. It should be noted that the adjustment of the lasing frequency can be realized even by the voltage drive in the ladder filter.

Fifth Embodiment

Multi-Wavelength Optical Modulation Signal Generating Device

Figure 26A:
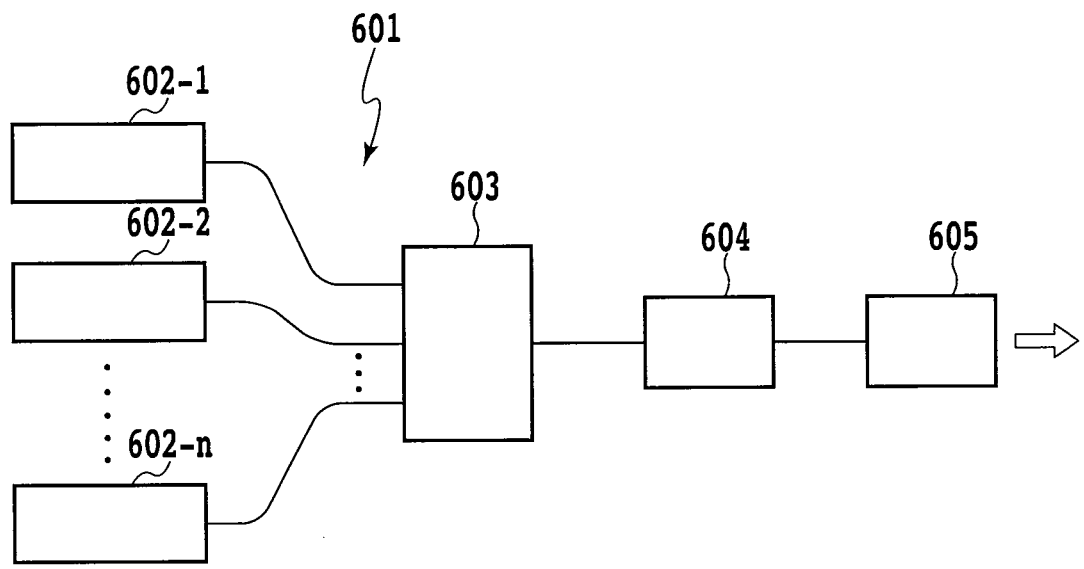
FIG. 26A is a diagram showing the construction of a multi-wavelength optical modulation signal generating device according to a fifth embodiment.
Figure 26B:
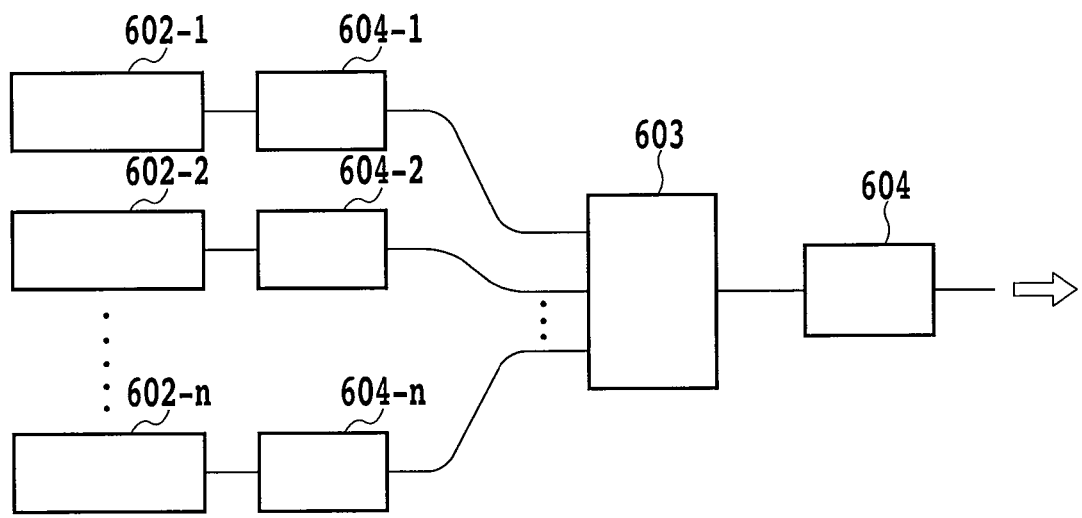
FIG. 26B is a diagram showing the construction of the multi-wavelength optical modulation signal generating device according to the fifth embodiment.

FIGS. 26A and 26B each show the construction of a multi-wavelength optical modulation signal generating device according to a fifth embodiment of the present invention. A case of applying the present embodiment to a multi-wavelength optical source will be explained. A multi-wavelength optical modulation signal generating device 601 shown in FIG. 26A includes optical sources 602-1 to 602-n each outputting an optical signal having a different center wavelength, a coupler 603 for multiplexing a plurality of optical signals from the optical source 602 to output a wavelength multiplexing signal, a semiconductor optical amplifier (SOA) 604 for amplifying the wavelength multiplexing signal, and a frequency filter 605. The coupler 603 may use an arrayed waveguide grating type (AWG) multiplexer and a multi-mode interference type (MMI) multiplexer.

The conventional multi-wavelength optical source uses EA-DFB-LD as the optical source 602. Therefore, as described above, the frequency fluctuation of the optical signal is caused at the rising and falling of the optical signal, creating the difficulty of realizing the long-distance transmission. In addition, since an intensity modulation component is contained in the wavelength multiplexing signal amplified at the SOA 604, a pattern effect occurs, thereby generating deterioration of the optical signal at optical fiber propagating.

Therefore, the optical source 102 shown in the first to fourth embodiments is applied as the optical source 602, which is connected to the frequency filter 605 to restrict the frequency fluctuation. Thereby the high-speed modulation and the long-distance transmission can be realized. In addition, since the optical signal outputted from the optical source 602 does not contain an intensity modulation component, the pattern effect in the SOA 604 does not occur, and therefore, it is possible to efficiently amplify the wavelength multiplexing signal.

The frequency filter 605 may be provided with an individual filter for each wavelength of the wavelength multiplexing signal. In addition, in a case where a frequency interval between center frequencies of optical signals from the plurality of the optical sources 602 is constant, the number of the frequency filters may be made to one. This frequency filter is set so that a frequency interval between transmission peaks is periodical and a value of the frequency interval of the optical signal is equal to an integral multiple of the frequency interval of the transmission peak. For example, when the frequency interval between the center frequencies of the optical signals is 100 GHz, a filter of which FSR is 50 GHz, 100 GHz or the like may be used. Since the same slope can be used in the transmission spectrum of the filter to each wavelength at this time, uniform frequency control is possible. Examples of such a filter may include a ring filter, a Mach-Zehnder filter, an etalon filter, a complex etalon filter, a lattice type filter, AWG and the like. In addition, even in a case where the frequency interval of the optical signal is an unequal interval, if the frequency interval of the filter is adjusted to the frequency interval of the optical signal, the effect can be obtained by a single filter.

The multi-wavelength optical modulation signal generating device 601 shown in FIG. 26B includes the optical sources 602-1 to 602-n each outputting an optical signal having a different center wavelength, semiconductor optical amplifiers (SOA) 604-1 to 604-n amplifying light from each optical source, the coupler 603 for multiplexing a plurality of optical signals from the semiconductor optical amplifiers 604 to output a wavelength multiplexing signal, and the frequency filter 605. Each of the optical source 602, the coupler 603 and the frequency filter 605 may use the construction shown in FIG. 26A. In a case of the construction shown in FIG. 26B, by adjusting drive current in each SOA, optical output of each channel can be increased and it is possible to uniform the output light.

Since the optical signal outputted from the optical source 602 does not contain the intensity modulation component also in this construction, the pattern effect in the SOAs 604-1 to 604-n does not occur. Accordingly, the high-speed modulation and the high-output wavelength multiplexing signal can be generated, and further, by using the frequency filter 605, the intensity modulation is generated and the frequency fluctuation is restricted, thus making it possible to realize the high-speed modulation and the long-distance transmission.

(Specific Example of Multi-Wavelength Optical Modulation Signal Generating Device)

Figure 27:
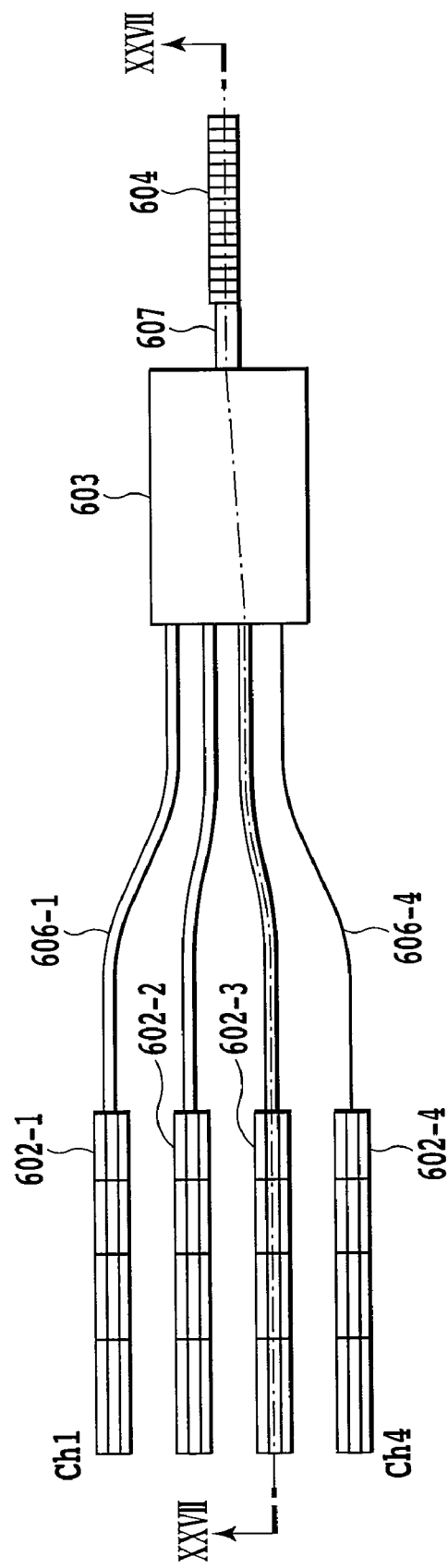
FIG. 27 is a diagram showing the specific construction of the multi-wavelength optical modulation signal generating device according to the fifth embodiment.

FIG. 27 shows the specific construction of the multi-wavelength optical modulation signal generating device according to the fifth embodiment. The specific construction of the multi-wavelength optical modulation signal generating device 601 shown in FIG. 26A is described below. The optical sources 602-1 to 602-4 each outputting an optical signal having a different center wavelength each are DBR-LD. A lasing frequency interval of each optical source is 200 GHz. The respective optical sources are connected via S-letter shaped waveguides 606-1 to 601-4 to the coupler 603. The coupler 603 is made of a MMI multiplexer. Output of the coupler 603 is connected via an output waveguide 607 to the semiconductor optical amplifier (SOA) 604.

Figure 28:
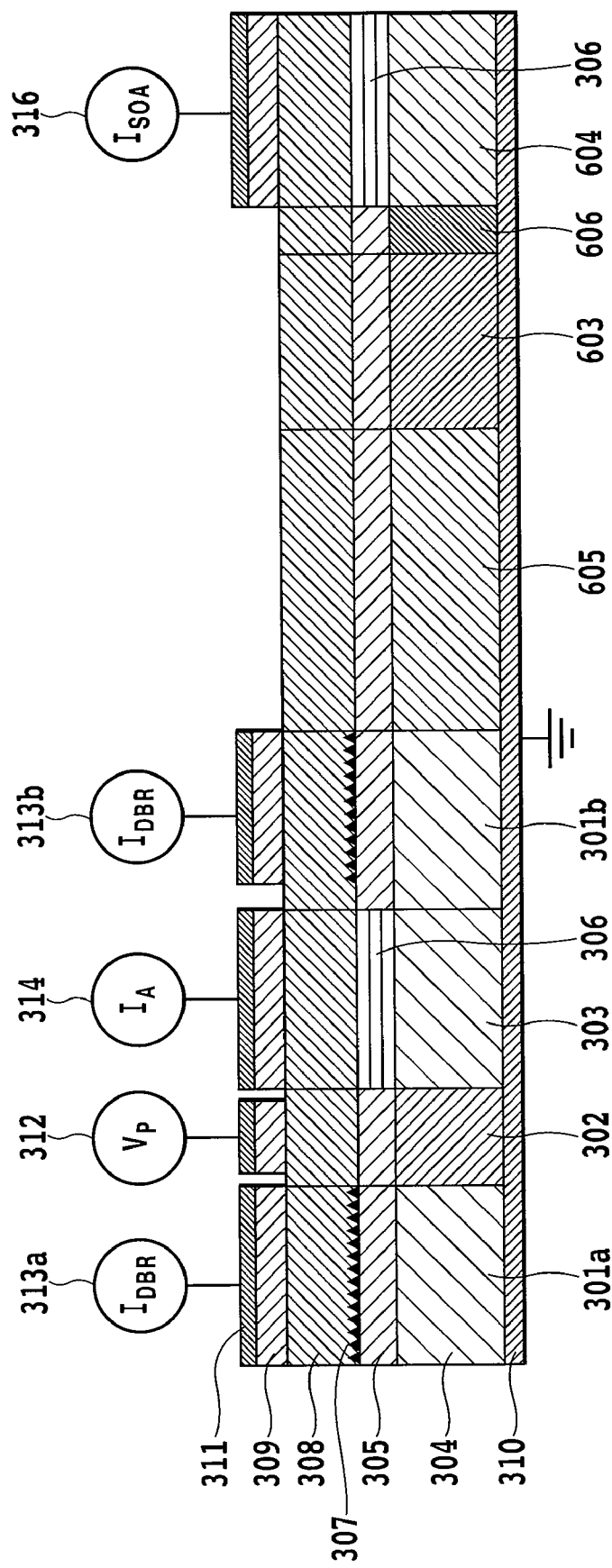
FIG. 28 is a diagram showing an optical source of the multi-wavelength optical modulation signal generating device according to the fifth embodiment.

FIG. 28 shows the construction of the optical source and is a cross section in a vertical direction along a dotted line XXVII shown in FIG. 27. The optical source 602-3 consists of the post-DBR region 301a having a length of 400 μm, the phase modulation region 302 having a length of 100 μm, the active layer region 303 having a length of 100 μm, the pre-DBR region 301b having a length of 200 μm, the S-letter shaped waveguide 606-3 having a length of 1000 μm, the 4×1 MMI region 603 having a width of 20 μm and a length of 200 μm, the output waveguide 607, and the SOA region 604 having a length of 400 μm toward an exist direction of light. Each of the S-letter shaped waveguide and the output waveguide is configured of a ridge structure having a width of 2.5 μm.

A structure of each of the DBR regions 301a and 301b, the phase adjusting region 302, the S-letter shaped waveguide 606-3, the MMI region 603, and the output waveguide 607 in a vertical direction is configured of the waveguide layer 305 of a bulk InGaAsP having a band gap wavelength of 1.3 μm and a thickness of 300 nm on the n-type cladding layer 304 having a dope quantity of $1\times10^{18}$ cm$^{-3}$. A structure of each of the active layer region 303 and the SOA region 604 in a vertical direction is configured of an eight-layer InGaAsP quantum well layer having a transition wavelength of 1.55 μm and having optical separate confinement heterostructure layers upwards and downwards on the n-type cladding layer 304. The diffraction grating 307 having a coupling constant of 40 cm$^{-1}$ is provided above a wavelength layer of each of the DBR regions 301a and 301b. The p-type InP cladding layer 308 having a dope quantity of $1\times10^{18}$ cm$^{-3}$ and a thickness of 1 μm, the InGaAsP contact layer 309 having a thickness of 0.5 μm, and the p-side electrode 311 are laminated on these layers. In addition, the n-side electrode 310 is provided under the n-type cladding layer 304.

The phase adjusting voltage controller 312 is connected to the phase adjusting region 302, the lasing wavelength controlling current devices 313a and 313b are connected to the DBR regions 301a and 301b, the active layer current controller 314 is connected to the active layer region 303 and the SOA current controller 316 is connected to the SOA region.

Figure 29:
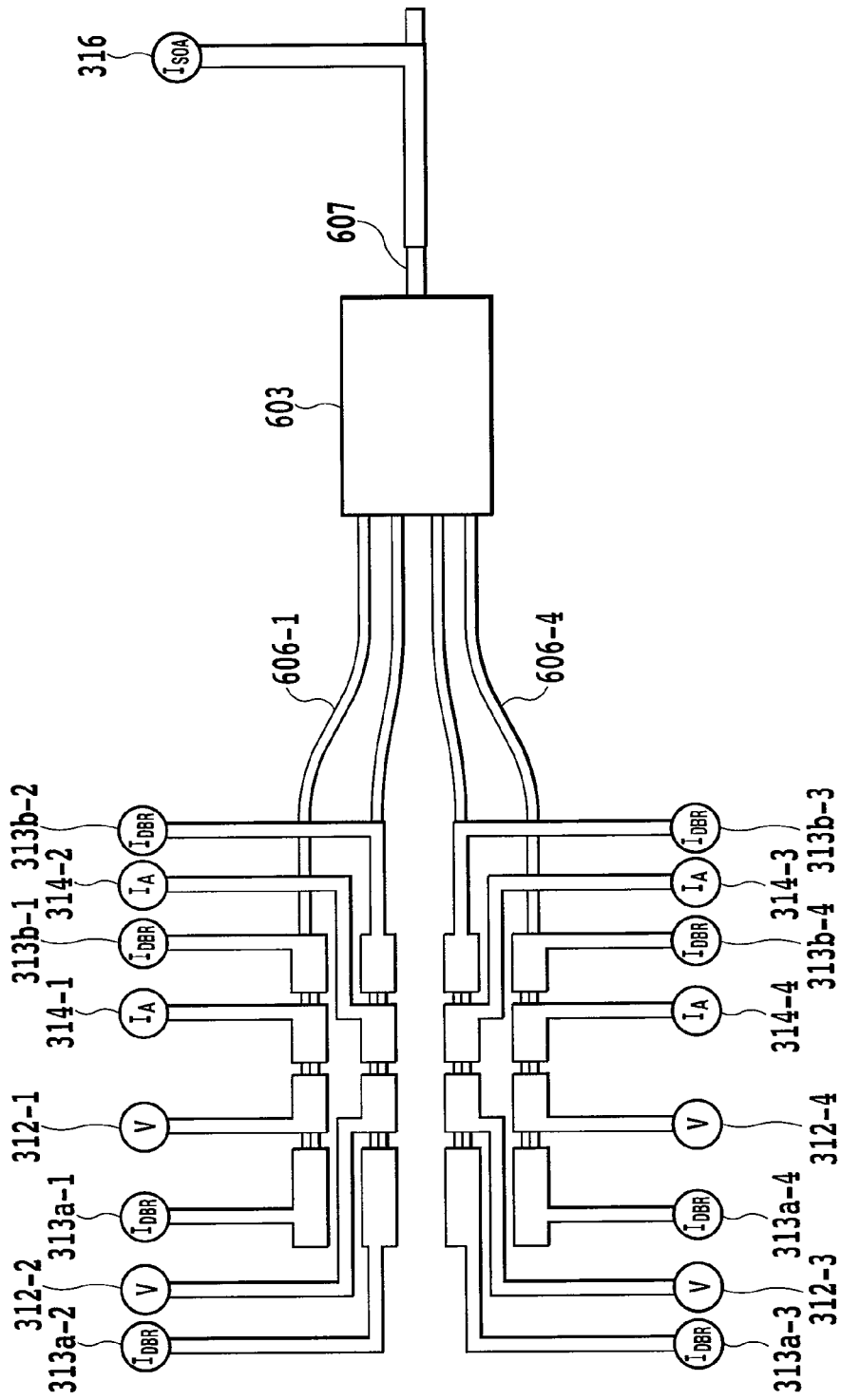
FIG. 29 is a diagram showing connection between the optical source and a controller according to the fifth embodiment.

FIG. 29 shows the connection between the optical source and the controller according to the fifth embodiment. In each of the optical sources 602-1 to 602-4, phase adjusting voltage controllers 312-1 to 312-4 are connected via the p-side electrode 311 to the phase control region 302. Likewise, lasing wavelength controlling current devices 313a-1 to 313a-4, and 313b-1 to 313b-4 are connected to the DBR regions 301a and 301b, active layer current controllers 314-1 to 314-4 are connected to the active layer region 303, and the SOA current controller 316 is connected to the SOA region.

FIG. 30A shows an oscillation spectrum at the time of modulating the optical source according to the fifth embodiment. When the current injection is made from the active layer current controllers 314-1 to 314-4, the optical sources 602-1 to 602-4 oscillate substantially by an interval of 200 GHz in accordance with a Bragg wavelength of each diffraction grating. Further, the lasing wavelength can be adjusted by injecting current in the DBR regions 301a and 301b by the lasing wavelength controlling current devices 313a-1 to 313a-4, and 313b-1 to 313b-4 to accurately set an interval of 200 GHz.

A frequency modulation amplitude of 10 GHz and modulation of 20 Gbps are added to each channel by the phase adjusting voltage controllers 312-1 to 312-4. By passing this signal through a frequency filter in which a frequency interval of center frequencies is 200 GHz, an intensity modulation signal is generated. Specially, for example, the etalon filter having a FSR interval of 100 GHz shown in the first embodiment can be used.

FIG. 30B shows a transmission spectrum of the frequency filter. By thus using the similar slope to all the channels, the intensity modulation signal can be generated to all the channels at a time. As shown in the first embodiment, by restricting the frequency fluctuation component, the high-speed and long-distance transmission can be realized simultaneously at the plural channels.

Sixth Embodiment

Figure 31:
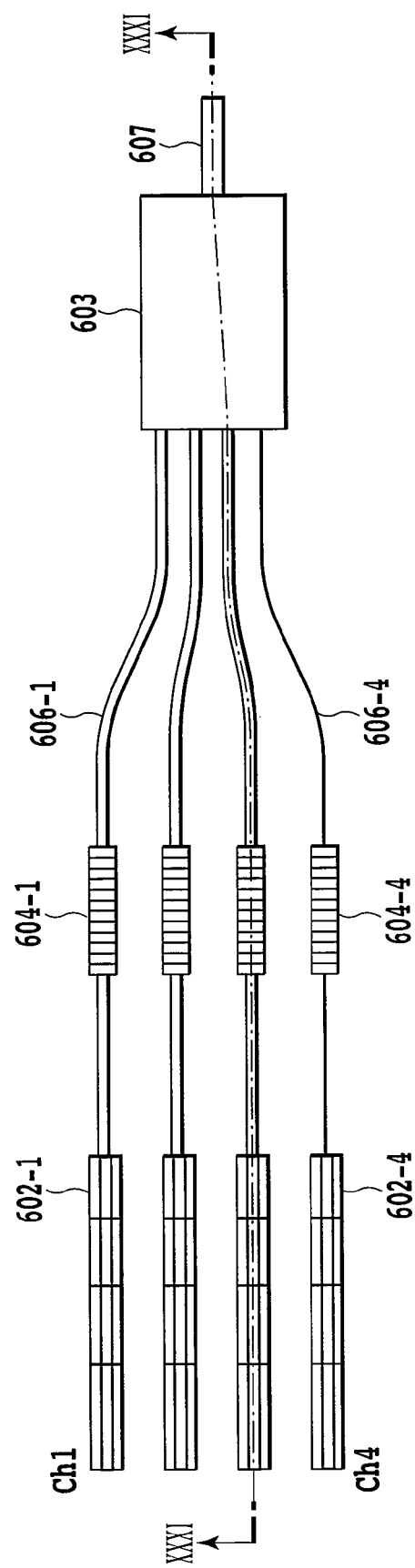
FIG. 31 is a diagram showing the specific construction of a multi-wavelength optical modulation signal generating device according to a sixth embodiment.

FIG. 31 shows the specific construction of a multi-wavelength optical modulation signal generating device according to the six embodiment. The specific construction of the multi-wavelength optical modulation signal generating device 601 shown in FIG. 26B is described below. The optical sources 602-1 to 602-4 each outputting an optical signal having a different center wavelength each are DBR-LD. A lasing frequency interval of each optical source is 200 GHz. The respective optical sources are connected via the semiconductor optical amplifiers (SOA) 604-1 to 604-4 and the S-letter shaped waveguides 606-1 to 606-4 to the coupler 603. The coupler 603 is made of a MMI multiplexer. Output of the coupler 603 is connected to the output waveguide 607.

Figure 32:
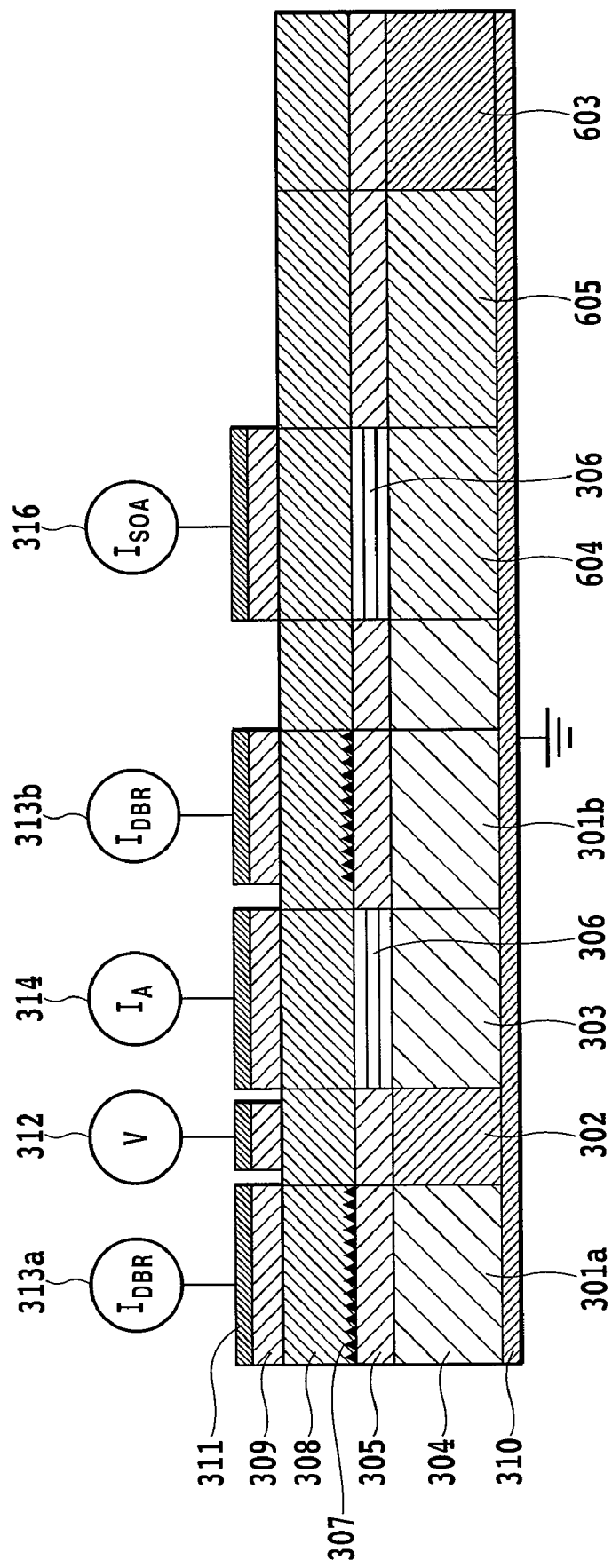
FIG. 32 is a diagram showing an optical source of the multi-wavelength optical modulation signal generating device according to the sixth embodiment.

FIG. 32 shows the construction of the optical source and is a cross section in a vertical direction along a dotted line XXXI shown in FIG. 31. The optical source 602-3 consists of the post-DBR region 301a having a length of 400 µm, the phase modulation region 302 having a length of 100 µm, the active layer region 303 having a length of 100 µm, the pre-DBR region 301b having a length of 200 µm, the SOA region 604-3 having a length of 400 µm, the S-letter shaped waveguide 606-3 having a length of 1000 µm, the 4×1 MMI region 603 having a width of 20 µm and a length of 200 µm, and the output waveguide 607 toward an exist direction of light. Each of the S-letter shaped waveguide and the output waveguide is configured of a ridge structure having a width of 2.5 µm.

A structure of each of the DBR regions 301a and 301b, the phase adjusting region 302, the S-letter shaped waveguide 606-3, the MMI region 603, and the output waveguide 607 in a vertical direction is configured of the waveguide layer 305 of the bulk InGaAsP having a band gap wavelength of 1.3 µm and a thickness of 300 nm on the n-type cladding layer 304 having a dope quantity of $1 \times 10^{18}$ cm$^{-3}$. A structure of each of the active layer region 303 and the SOA region 604 in a vertical direction is configured of the eight-layer InGaAsP quantum well layer having a transition wavelength of 1.55 µm and having the optical separate confinement heterostructure layers upwards and downwards on the n-type cladding layer 304. The diffraction grating 307 having a coupling constant of 40 cm$^{-1}$ is provided above the wavelength layer of each of the DBR regions 301a and 301b. The p-type InP cladding layer 308 having a dope quantity of $1 \times 10^{18}$ cm$^{-3}$ and a thickness of 1 µm, the InGaAsP contact layer 309 having a thickness of 0.5 µm, and the p-side electrode 311 are laminated on these layers. In addition, the n-side electrode 310 is provided under the n-type cladding layer 304.

The phase adjusting voltage controller 312 is connected to the phase control region 302, the lasing wavelength controlling current devices 313a and 313b are connected to the DBR regions 301a and 301b, the active layer current controller 314 is connected to the active layer region 303, and the SOA current controller 316 is connected to the SOA region.

Figure 33:
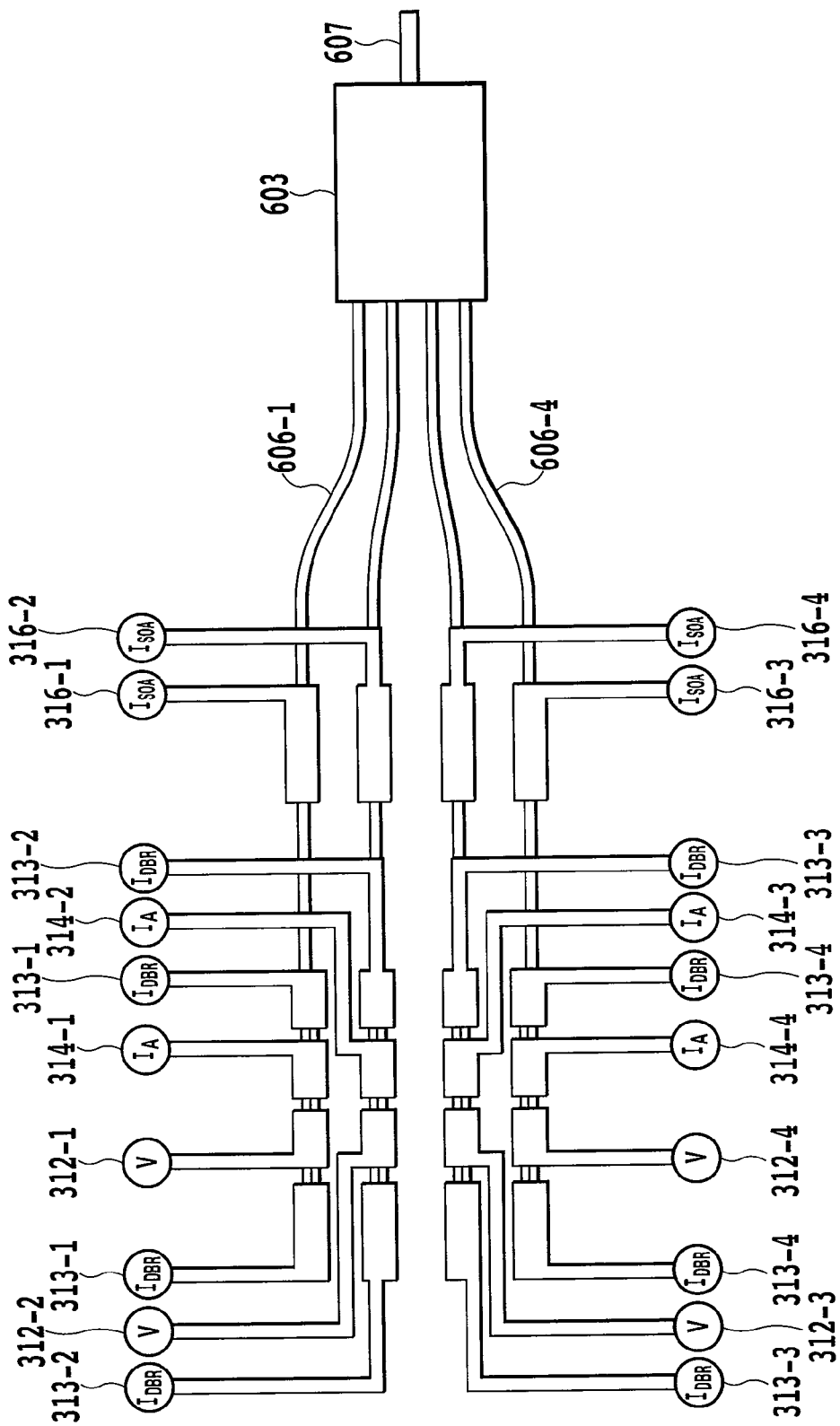
FIG. 33 is a diagram showing connection between the optical source and a controller according to the sixth embodiment.

FIG. 33 shows the connection between the optical source and the controller according to the sixth embodiment. In each of the optical sources 602-1 to 602-4, the phase adjusting voltage controllers 312-1 to 312-4 are connected through the p-side electrode 311 to the phase control region 302. Likewise, the lasing wavelength controlling current devices 313a-1 to 313a-4, and 313b-1 to 313b-4 are connected to the DBR regions 301a and 301b, the active layer current controllers 314-1 to 314-4 are connected to the active layer region 303, and the SOA current controllers 316-1 to 316-4 are connected to the SOA region.

Different from the fifth embodiment, the SOAs 604-1 to 604-4 are connected to the optical sources 602-1 to 602-4 respectively, and the SOA current controllers 316-1 to 316-4 are connected to the respective SOAs. This optical source is used to perform the frequency modulation operation in the same way as the fifth embodiment as shown in FIG. 30, and the frequency filter is used, thereby making it possible to realize the high-speed and long-distance transmission at the plural channels simultaneously.

Seventh Embodiment

The SOA described in the fifth embodiment can be applied not only to the multi-wavelength optical source, but also to the optical source 102 in the first to fourth embodiments. By inserting the SOA between the optical source 102 and the frequency filter 103, the high-speed modulation and the long-distance transmission can be realized.

Figure 34:
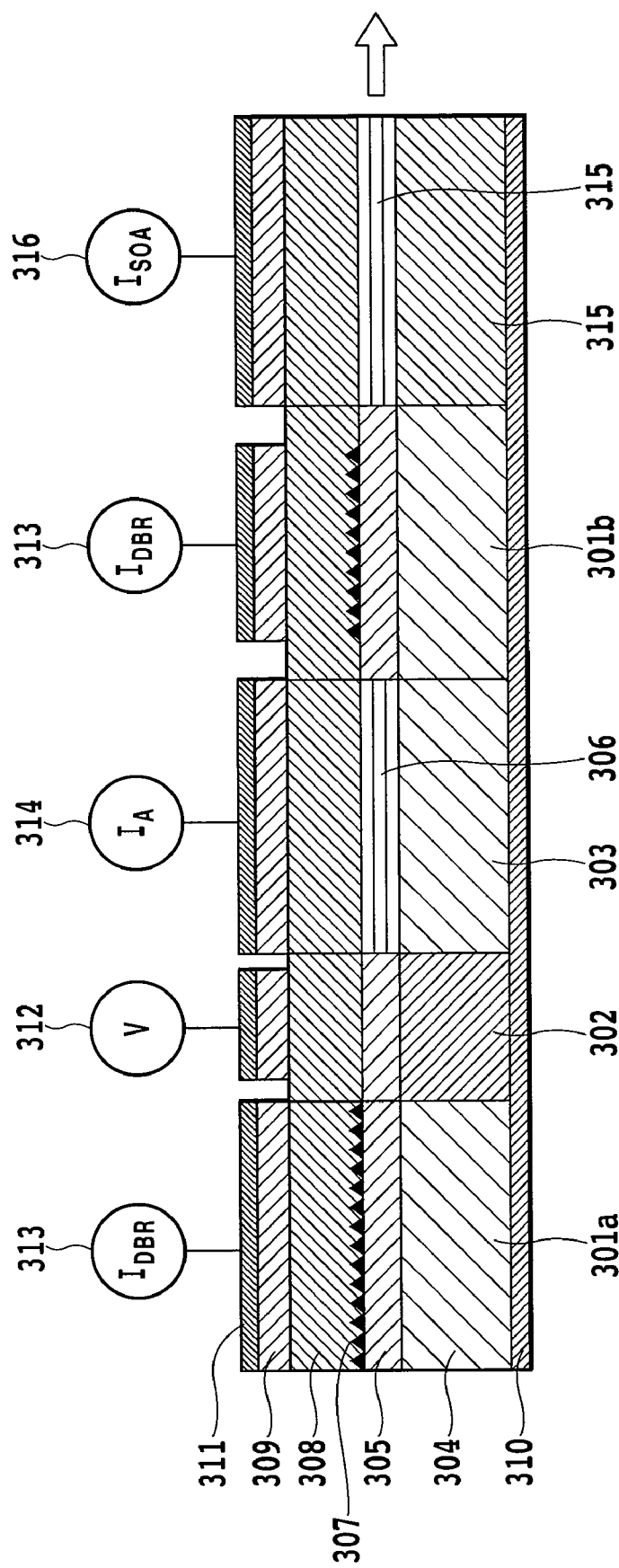
FIG. 34 is a diagram showing the specific construction of an optical source according to a seventh embodiment.

FIG. 34 shows the specific construction of the optical source according to the seventh embodiment. The optical source 102 adds the SOA to the optical source according to the second embodiment shown in FIG. 23. That is, the optical source 102 is the distributed Bragg reflector laser equipped with the DBR region 301a, the phase adjusting region 302, the active layer region 303, the DBR region 301b, and the semiconductor optical amplifier (SOA) region 315 toward an exit direction of light. The SOA current controller 316 is connected to the SOA region 315. A reflection prevention film is formed in an end surface of the semiconductor optical amplifier side.

When current is injected from the active layer current controller 314, the laser oscillation is generated between the DBR regions 301a and 301b and the frequency modulation is superposed by the phase adjusting voltage in the phase adjusting region 302. The frequency modulation signal is input from the exit-side DBR region 301b to the SOA region 315 and is amplified by current input from the SOA current controller 316 to the SOA region. Since the optical signal to be outputted at this time does not contain the intensity modulation component, the pattern effect in the SOA region does not occur. Accordingly, the signal light can be efficiently amplified to provide the high-output. The frequency filter 103 is connected to the optical source to restrict the frequency fluctuation, thus making it possible to realize the high-speed modulation and the long-distance transmission.

Eighth Embodiment

Other Embodiment

In the first to fourth embodiments, the etalon filter, the Mach-Zehnder filter, the lattice type filter, the coupled-cavity etalon filter, and the ring resonator filter are shown as the frequency filter for converting the frequency modulation component of the optical signal into the intensity modulation component and the frequency modulation component, but even by using the other various filters such as a fiber Bragg grating and AWG, the similar effect can be obtained. As described above, not only the transmission type filter, but also the reflective mirror may be used.

In addition, in regard to the construction used in the wavelength selective type filter region in the optical source, any construction in which the wavelength selective characteristic exists in the transmission characteristic and the reflective characteristic may be applied.

In the first to fourth embodiments, the frequency of the signal corresponding to the NRZ signal of "1" is set to a frequency higher than the frequency of the signal corresponding to the NRZ signal of "0". In reverse, the frequency of the signal corresponding to the NRZ signal of "1" may be set to a frequency lower than the frequency of the signal corresponding to the NRZ signal of "0". At this time the frequency setting condition shown in FIG. 9 is set so that the frequency of the optical signal corresponding to "0" is provided as a transmission peak and the frequency of the optical signal corresponding to "1" is set to a high frequency wave side.

The first to fourth embodiments describe only a case of no intensity modulation component in the optical signal, but even in a case where the intensity modulation component exists, the frequency control is possible although it is worse in view of the high-speed modulation, and the effect similar to that in the present embodiment can be obtained. In addition, the NRZ signal is used as the signal from the signal source in the present embodiment, but the similar effect can be obtained even using the other signal such as a RZ signal.

As described above, according to the present embodiment, the optical signal having only the frequency modulation component is converted into the intensity modulation component and the frequency modulation component by using the frequency filter to restrict the frequency fluctuation at frequency modulating, and therefore, the high-speed modulation and the long-distance transmission can be performed.

The invention claimed is:

1. An optical modulation signal generating device which converts a signal from a signal source into an optical signal and outputs the optical signal to a transmission medium having frequency dispersion, said device comprising:
   an optical source for performing frequency modulation of the signal from the signal source to generate the modulated optical signal, the optical source comprising a laser comprising:
      an active layer region that generates a spontaneous emission light by applying a first current to the active layer region;
      a wavelength selective filter region; and
      a phase adjusting region,
      wherein a lasing wavelength is adjusted by applying a second current to the wavelength selective filter region, and
      wherein the frequency modulation is performed by applying a voltage to the phase adjusting region; and
   a frequency filter for converting a frequency modulation component of the modulated optical signal into an intensity modulation component and a frequency modulation component.

2. An optical modulation signal generating device according to claim 1, further comprising:
   a semiconductor optical amplifier which amplifies the modulated optical signal from the optical source and outputs the amplified optical signal to the frequency filter.

3. An optical modulation signal generating device according to claim 1, wherein said device comprises a plurality of signal sources and a plurality of optical sources, each of the optical sources performing frequency modulation of the signals from each of the signal sources to generate modulated optical signals having different center wavelengths from each other,
   wherein said device comprises a coupler for multiplexing the modulated optical signals from the plurality of the optical sources to output a wavelength multiplexing optical signal, and
   wherein the frequency filter converts a frequency modulation component of the modulated optical signal contained in the wavelength multiplexing optical signal into an intensity modulation component and a frequency modulation component.

4. An optical modulation signal generating device according to claim 3, further comprising:
   a semiconductor optical amplifier which amplifies the wavelength multiplexing optical signal from the coupler and outputs the amplified wavelength multiplexing optical signal to the frequency filter.

5. An optical modulation signal generating device according to claim 3, further comprising:
   a plurality of semiconductor optical amplifiers each being interposed between a different one of the plurality of the optical sources and the coupler to amplify the corresponding modulated optical signal and output the amplified modulated optical signal to the coupler.

6. An optical modulation signal generating device according to claim 3, wherein,
   a frequency interval between center frequencies of the modulated optical signals from the plurality of the optical sources is constant,
   a frequency interval between transmission peaks of the frequency filter is periodical, and a value of the frequency interval of the modulated optical signals is set to be an integral multiple of the frequency interval between the transmission peaks.

7. An optical modulation signal generating device according to claim 1, wherein the wavelength selective filter region comprises any one of a distributed Bragg reflector mirror, a coupled ring filter or a ladder filter, said coupled ring filter is made of a plurality of ring resonators having different ring diameters, and said ladder filter has a plurality of waveguides and both ends of the plurality of waveguides having different optical path lengths are connected respectively to two waveguides in a ladder shape.

8. An optical modulation signal generating device according to claim 1, wherein the optical source has a value of a modulation width of the frequency modulation set between ¼ and ¾ of a bit rate in transmission by the optical signal.

9. An optical modulation signal generating device according to claim 1, wherein parameters of an amplitude component and a phase component in the frequency filter are adjusted to restrict a fluctuation of the frequency modulation component of the modulated optical signal.

10. An optical modulation signal generating device according to claim 1, wherein the frequency filter includes any one of an etalon filter, a Mach-Zehnder interferometer filter, a lattice type filter, a coupled-cavity etalon filter, or a ring resonator filter.

11. An optical modulation signal generating method which converts a signal from a signal source into an optical signal and outputs the optical signal to a transmission medium having frequency dispersion, said method comprising:

at a laser including an active layer region generating a spontaneous emission light, a wavelength selective filter region, and a phase adjusting region, applying a current to the wavelength selective filter region to adjust a lasing wavelength of the laser and applying a voltage to the phase adjusting region to perform frequency modulation of the signal from the signal source to generate the modulated optical signal; and converting a frequency modulation component of the modulated optical signal into an intensity modulation component and a frequency modulation component.

* * * * *